US011777449B1

(12) United States Patent
Holland et al.

(10) Patent No.: US 11,777,449 B1
(45) Date of Patent: Oct. 3, 2023

(54) FREQUENCY MIXING

(71) Applicant: QUALCOMM Incorporated, San Diego, CA (US)

(72) Inventors: Kyle David Holland, San Diego, CA (US); Jang Joon Lee, San Diego, CA (US); Dongling Pan, San Diego, CA (US); Aleksandar Miodrag Tasic, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/933,609

(22) Filed: Sep. 20, 2022

(51) Int. Cl.
*H03D 7/14* (2006.01)
*H03D 7/12* (2006.01)

(52) U.S. Cl.
CPC ............. *H03D 7/1425* (2013.01); *H03D 7/12* (2013.01); *H03D 2200/0066* (2013.01)

(58) Field of Classification Search
CPC ............ H03D 7/12; H03D 7/125; H03D 7/14; H03D 7/1425; H03D 7/1441; H03D 7/1466; H03D 7/1483; H03D 7/16; H03D 7/165
See application file for complete search history.

(56) References Cited

U.S. PATENT DOCUMENTS

| 7,308,244 B2* | 12/2007 | Chang | H03D 7/1491 |
| | | | 455/131 |
| 2009/0111377 A1* | 4/2009 | Mitomo | H03D 7/165 |
| | | | 455/20 |

* cited by examiner

*Primary Examiner* — Long Nguyen
(74) *Attorney, Agent, or Firm* — Colby Nipper QUALCOMM Incorporated

(57) ABSTRACT

An apparatus is disclosed for mixing signals. In example aspects, the apparatus includes a mixer circuit having multiple local oscillator nodes, a first node corresponding to a first frequency, and multiple second nodes corresponding to a second frequency. The mixer circuit includes multiple capacitors coupled between the multiple local oscillator nodes and the multiple second nodes. The mixer circuit has multiple switches including a first switch, a second switch, a third switch, and a fourth switch. The multiple switches are coupled between the multiple capacitors and the multiple second nodes. The first switch and the second switch are coupled between the multiple capacitors and the first node. The first switch and the second switch are disposed between the fourth switch and the third switch.

30 Claims, 8 Drawing Sheets

FREQUENCY MIXING

TECHNICAL FIELD

This disclosure relates generally to signal communication or signal processing using an electronic device and, more specifically, to a mixer circuit that can be used for frequency conversion.

BACKGROUND

Electronic devices include traditional computing devices such as desktop computers, notebook computers, smartphones, wearable devices like a smartwatch, internet servers, and so forth. Electronic devices also include other types of computing devices such as personal voice assistants (e.g., smart speakers), wireless access points or routers, thermostats and other automated controllers, robotics, automotive electronics, devices embedded in other machines like refrigerators and industrial tools, Internet of Things (IoT) devices, medical devices, and so forth. These various electronic devices provide services relating to productivity, communication, social interaction, security, health and safety, remote management, entertainment, transportation, and information dissemination. Thus, electronic devices play crucial roles in modern society.

Many of the services provided by electronic devices in today's interconnected world depend at least partly on electronic communications. Electronic communications can include, for example, those exchanged between two or more electronic devices using wireless or wired signals that are transmitted over one or more networks, such as the Internet, a Wi-Fi® network, or a cellular network. Electronic communications can therefore include wireless or wired transmissions and receptions. To transmit and receive communications, an electronic device can use a transceiver, such as a wireless transceiver that is designed for wireless communications.

Electronic communications can therefore be realized by propagating signals between two wireless transceivers at two different electronic devices. For example, using a wireless transmitter, a smartphone can transmit a wireless signal to a base station over the air as part of an uplink communication to support mobile services. Using a wireless receiver, the smartphone can receive a wireless signal that is transmitted from the base station via the air medium as part of a downlink communication to enable mobile services. With a smartphone, mobile services can include making voice and video calls, participating in social media interactions, sending messages, watching movies, sharing videos, performing searches, using map information or navigational instructions, finding friends, engaging in location-based services generally, transferring money, obtaining another service like a car ride, and so forth.

Many of these mobile services depend at least partly on the transmission or reception of wireless signals between two or more electronic devices. Consequently, researchers, electrical engineers, and designers of electronic devices strive to develop wireless transceivers that can use wireless signals effectively to provide these and other mobile services.

SUMMARY

To transmit or receive wireless signals, a wireless transceiver or a radio-frequency (RF) front-end can include a transmit chain or a receive chain that processes a propagating signal. Part of the signal processing may include converting a signal from a first frequency to a second frequency. A mixer circuit can perform a frequency conversion using a local oscillator signal from a local oscillator (LO). The mixer circuit combines a first signal at the first frequency with the local oscillator signal to produce a second signal at the second frequency using multiple switches. For differential signaling at the input and/or output of the mixer circuit, the multiple switches may number four. To combat noise from the local oscillator, this document describes how the multiple switches can be disposed symmetrically on a substrate. For example, first and second switches can be positioned on different sides of a line of symmetry. Additionally or alternatively, third and fourth switches can be disposed on opposite sides of the first and second switches such that the first and second switches are "sandwiched" between the third and fourth switches along an axis lying in the plane of the substrate, with the axis perpendicular to the line of symmetry. Further, area reduction and layout simplification can be facilitated by employing coupling capacitors and/or biasing resistors that are each shared between at least two switches of the multiple switches. In such cases, a local oscillator signal or a bias signal can propagate through a given capacitor or resistor, respectively, to reach the at least two switches that share the capacitor or resistor. These and other implementations are described herein.

In an example aspect, an apparatus for frequency mixing is disclosed. The apparatus includes a mixer circuit. The mixer circuit includes multiple local oscillator nodes, a first node corresponding to a first frequency, and multiple second nodes corresponding to a second frequency. The mixer circuit also includes multiple capacitors coupled between the multiple local oscillator nodes and the multiple second nodes. The mixer circuit further includes multiple switches including a first switch, a second switch, a third switch, and a fourth switch. The multiple switches are coupled between the multiple capacitors and the multiple second nodes. The first switch and the second switch are coupled between the multiple capacitors and the first node. The first switch and the second switch are disposed between the fourth switch and the third switch.

In an example aspect, an apparatus for frequency mixing is disclosed. The apparatus includes a mixer circuit. The mixer includes multiple local oscillator nodes, a first node corresponding to a first frequency, and multiple second nodes corresponding to a second frequency. The mixer circuit also includes multiple capacitors and multiple switches. The multiple capacitors are coupled between the multiple local oscillator nodes and the multiple second nodes. The multiple switches include a first switch, a second switch, a third switch, and a fourth switch. The multiple switches are coupled between the multiple capacitors and the multiple second nodes. The first switch and the second switch are coupled between the multiple capacitors and the first node, and the third switch and the fourth switch are coupled to each other via a floating node. The mixer circuit further includes means for increasing symmetry-dependent linearity.

In an example aspect, an apparatus for frequency mixing is disclosed. The apparatus includes a mixer circuit. The mixer circuit includes a first local oscillator node, a second local oscillator node, and a first node corresponding to a first frequency. The mixer circuit also includes a first capacitor, a second capacitor, and a second node and a third node each corresponding to a second frequency. The mixer circuit additionally includes a first switch, a second switch, a third switch, and a fourth switch. The first switch is coupled between the first capacitor and the second node, and the first switch is further coupled between the first capacitor and the first node. The second switch is coupled between the second capacitor and the third node, and the second switch is further coupled between the second capacitor and the first node. The third switch is coupled between the first capacitor and the third node. The fourth switch is coupled between the second capacitor and the second node. The first capacitor is coupled between the first local oscillator node and the first and third switches, and the second capacitor is coupled between the second local oscillator node and the fourth and second switches.

In an example aspect, a method for mixing signals is disclosed. The method includes receiving, via a first node, a first signal at a first switch and a second switch, the first signal corresponding to a first frequency. The method also includes receiving, via a first capacitor, a plus local oscillator signal at the first switch and a third switch and receiving, via a second capacitor, a minus local oscillator signal at the second switch and a fourth switch. The method additionally includes mixing the first signal, the plus local oscillator signal, and the minus local oscillator signal to produce a second signal using the first, second, third, and fourth switches, with the second signal corresponding to a second frequency. The method further includes providing, via multiple second nodes, the second signal from the first, second, third, and fourth switches.

DETAILED DESCRIPTION

Introduction and Overview

Figure 1:
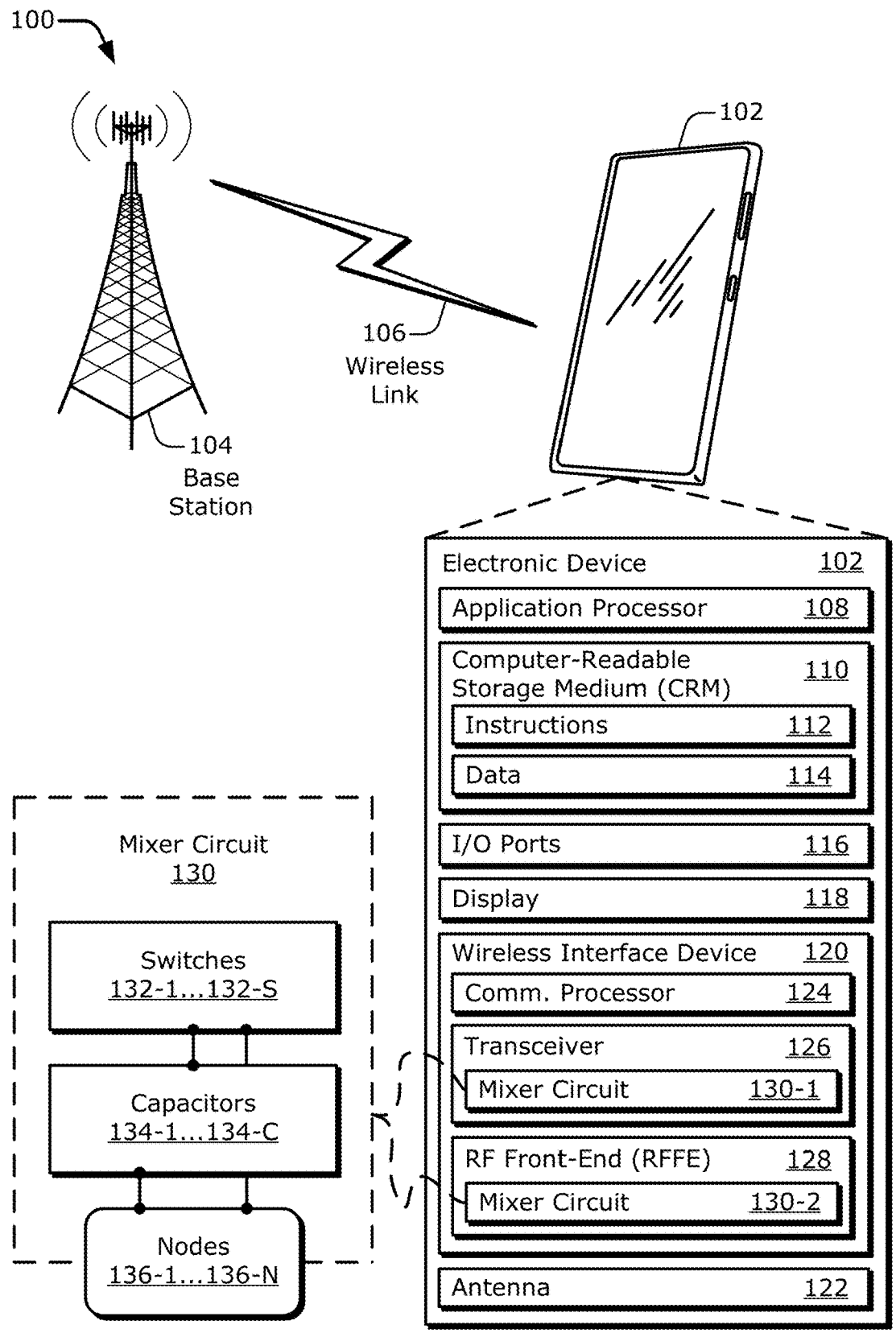
FIG. 1 illustrates an environment with an example electronic device that has a wireless interface device, which includes at least one example mixer circuit.

To facilitate transmission and reception of wireless signals, an electronic device can use a wireless interface device that includes a wireless transceiver and/or a radio-frequency (RF) front-end. Electronic devices communicate with wireless signals using electromagnetic (EM) signaling at various frequencies that exist on a portion of the EM spectrum. These wireless signals may travel between two electronic devices while oscillating at a particular frequency, such as a kilohertz (kHz) frequency, a megahertz (MHz) frequency, or a gigahertz (GHz) frequency. The EM spectrum is, however, a finite resource that limits how many signals can be simultaneously communicated in any given spatial area. There are already billions of electronic devices that use this limited resource. To enable a greater number of simultaneous communications using EM signaling, the finite EM spectrum can be shared among electronic devices. The EM spectrum can be shared using, for instance, frequency division multiplexing (FDM) techniques and/or time division multiplexing (TDM) techniques.

Techniques for FDM or TDM can entail separating the EM spectrum into different frequency bands and constraining communications to occur within an assigned frequency band. EM signals in different frequency bands can be communicated at the same time in a same area without significantly interfering with each other. To transmit a signal within a target frequency band, a transceiver can apply a mixer to the signal to upconvert a relatively lower frequency to reach the target frequency band. To recover information carried by a signal that is received in the target frequency band, the transceiver can apply a mixer to the received signal to down-convert from the target frequency band to a lower frequency.

To perform frequency conversion, a mixer circuit operates in conjunction with a local oscillator that produces a local oscillator signal. The mixer circuit "combines" (e.g., multiplies) an input signal with the local oscillator signal to produce an output signal. The mixer circuit can be configured such that the output signal has a higher frequency than the input signal for frequency up-conversion as part of processing a signal to be transmitted in a transmit chain. Alternatively, the mixer circuit can be configured such that the output signal has a lower frequency than the input signal for frequency down-conversion as part of processing a received signal in a receive chain. The frequency of the output signal is dependent, at least partly, on a frequency of the local oscillator signal provided by the local oscillator.

Although the local oscillator contributes to the frequency conversion process, the local oscillator can introduce noise into this process through the local oscillator signal. The local oscillator can be coupled to different types of mixers, such as a double-balanced mixer or a single-balanced mixer. A double-balanced mixer uses balanced signals (e.g., differential signaling) for both the input and the output signals. A single-balanced mixer, in contrast, uses a least one unbalanced signal (e.g., single-ended signaling) for the input signal or the output signal.

In some frequency conversion situations, a double-balanced mixer can perform better than a single-balanced mixer, for example in terms of handling noise injected by the local oscillator signal. The balanced signals at the input and the output of the mixer can cancel the injected noise to at least some extent. A double-balanced mixer, however, may occupy an appreciably greater area for the frequency conversion as compared to a single-balanced mixer. In other words, a single-balanced mixer can occupy relatively less area than a double-balanced mixer. The smaller area derives, in part, from being able to omit a transformer, which typically occupies a relatively larger space, from the unbalanced side of a single-balanced mixer.

Unfortunately, the unbalanced signal of the single-balanced mixer may handle the injected noise relatively less well than the two balanced signals of the double-balanced mixer. The inferior noise handling of the single-balanced mixer conflicts, therefore, with the smaller area occupied by the single-balanced mixer, and the smaller area can be an important advantage in certain implementations. Further, with unbalanced signaling, the layout and routing can be appreciably simplified. Consuming less area and enabling a simplified signal routing on a substrate can translate to a smaller or lower-cost device, including being both smaller and less expensive.

Moreover, the smaller area and simplified routing layout may become increasingly important as the quantity of frequency bands with which a wireless interface device is expected to operate increases. As described above, the range of frequencies at which devices are expected to communicate is increasing to enable faster communications at higher bandwidths and to allow for more devices to simultaneously share the finite EM spectrum. In addition to different frequency bands, electronic devices may be expected to handle different access protocols, including those related to various wireless standards like that for license-assisted access (LAA). These different frequency bands and access protocols result in electronic devices having increasing numbers of transmission and/or reception paths, like a greater quantity of transmit chains and/or receive chains. With each such path potentially including at least one mixer circuit, the area and layout differences between double-balanced mixers and single-balanced mixers can become even more impactful.

Thus, employing single-balanced mixers can appreciably reduce the size and/or cost of wireless interface devices, and therefore of their corresponding electronic devices. This document describes example approaches to using single-balanced mixers that compensate, at least partially, for the noise that is injected by a local oscillator signal provided by a local oscillator of a frequency converter. For example, component symmetry can be enhanced to lower a noise factor. Additionally or alternatively, components can be shared to further simplify layout and signal routing. Implementing one or more of these techniques can enable a single-balanced mixer, with its size and cost advantages, to be used instead of a double-balanced mixer.

Generally, a mixer circuit combines a first signal at a first frequency with a local oscillator signal at a local oscillator frequency to produce a second signal at a second frequency using multiple switches. The second frequency is different from the first frequency. The multiple switches can have a quantity greater than two, such as four switches. In some implementations, to combat noise from the local oscillator signal, at least a portion of the multiple switches can be disposed on a substrate symmetrically with respect to each other. For example, first and second switches of the multiple switches can be positioned on either side of a line of symmetry. Additionally or alternatively, third and fourth switches of the multiple switches can be disposed on opposite sides of the first and second switches such that the first and second switches are "sandwiched" between the third and fourth switches along an axis that lies in the plane of the substrate. The axis can be at least substantially perpendicular to the line of symmetry. Further, the first and second switches, which are "sandwiched" by the third and fourth ones, may be coupled to a same node. This same node may correspond to an input or an output of the mixer circuit and be configured to propagate an singled-ended, unbalanced signal.

In other implementations, area reduction and layout simplification can be facilitated by employing coupling capacitors and/or biasing resistors that are each shared between at least two switches of the multiple switches. With respect to a local oscillator, a local oscillator signal can propagate through a given capacitor to reach the at least two switches of the multiple switches. With respect to a power distribution network, a bias signal (e.g., a direct-current (DC) voltage) can propagate through a given resistor to reach the at least two switches. In certain cases, the at least two switches are nonadjacent to one another, such as the first switch and the third switch in some depicted examples. If the multiple switches are implemented with field-effect transistors (FETs), the local oscillator signal and the bias signal can be coupled to gate terminals of the FETs. These and other implementations are described herein.

Description Examples

FIG. 1 illustrates an example environment 100 with an electronic device 102 that has a wireless interface device 120, which includes at least one example mixer circuit 130. This document describes example implementations of the mixer circuit 130, which may be part of a transceiver, a radio-frequency front-end (RFFE), and so forth of an apparatus. In the environment 100, the example electronic device 102 communicates with a base station 104 through a wireless link 106. In FIG. 1, the electronic device 102 is depicted as a smartphone. The electronic device 102, however, may be implemented as any suitable computing or other electronic device. Examples of an apparatus that can be realized as an electronic device 102 include a cellular base station, broadband router, access point, cellular or mobile phone, gaming device, navigation device, media device, laptop computer, desktop computer, tablet computer, and server computer. Other examples of an apparatus that can be realized as an electronic device 102 include a network-attached storage (NAS) device, smart appliance, vehicle-based communication system, Internet of Things (IoT) device, sensor or security device, asset tracker, fitness management device, wearable device such as intelligent glasses or smartwatch, wireless power device (transmitter or receiver), medical device, and so forth.

The base station 104 communicates with the electronic device 102 via the wireless link 106, which may be implemented as any suitable type of wireless link that carries a communication signal. Although depicted as a base station tower of a cellular radio network, the base station 104 may represent or be implemented as another device, such as a satellite, terrestrial broadcast tower, access point, peer-to-peer device, mesh network node, fiber optic line interface, another electronic device as described above generally, and so forth. Hence, the wireless link 106 can extend between the electronic device 102 and the base station 104 in any of various manners.

The wireless link 106 can include a downlink of data or control information communicated from the base station 104 to the electronic device 102. The wireless link 106 can also include an uplink of other data or control information communicated from the electronic device 102 to the base station 104. The wireless link 106 may be implemented using any suitable wireless communication protocol or standard. Examples of such protocols and standards include a $3^{rd}$ Generation Partnership Project (3GPP) Long-Term Evolution (LTE) standard, such as a $4^{th}$ Generation (4G), a $5^{th}$ Generation (5G), or a $6^{th}$ Generation (6G) cellular standard; an IEEE 802.11 standard, such as 802.11g, ac, ax, ad, aj, or ay standard (e.g., Wi-Fi® 6 or WiGig®); an IEEE 802.16 standard (e.g., WiMAX®); a Bluetooth® standard; an ultra-wideband (UWB) standard (e.g., IEEE 802.15.4); and so forth. In some implementations, the wireless link 106 may provide power wirelessly, and the electronic device 102 or the base station 104 may comprise a power source.

As shown for some implementations, the electronic device 102 can include at least one application processor 108 and at least one computer-readable storage medium 110 (CRM 110). The application processor 108 may include any type of processor, such as a central processing unit (CPU) or a multi-core processor, that is configured to execute processor-executable instructions (e.g., code) stored by the CRM 110. The CRM 110 may include any suitable type of data storage media, such as volatile memory (e.g., random-access memory (RAM)), non-volatile memory (e.g., Flash memory), optical media (e.g., a disc), magnetic media (e.g., a disk or tape), and so forth. In the context of this disclosure, the CRM 110 is implemented to store instructions 112, data 114, and other information of the electronic device 102, and thus the CRM 110 does not include transitory propagating signals or carrier waves.

The electronic device 102 may also include one or more input/output ports 116 (I/O ports 116) and at least one display 118. The I/O ports 116 enable data exchanges or interaction with other devices, networks, or users. The I/O ports 116 may include serial ports (e.g., universal serial bus (USB®) ports), parallel ports, audio ports, infrared (IR) ports, camera or other sensor ports, and so forth. The display 118 can be realized as a display screen or a projection that presents graphical images provided by other components of the electronic device 102, such as a user interface (UI) associated with an operating system, program, or application. Alternatively or additionally, the display 118 may be implemented as a display port or virtual interface through which graphical content of the electronic device 102 is communicated or presented.

The electronic device 102 further includes at least one wireless interface device 120 and at least one antenna 122. The example wireless interface device 120 provides connectivity to respective networks and peer devices via a wireless link, which may be configured similarly to or differently from the wireless link 106. The wireless interface device 120 may facilitate communication over any suitable type of wireless network, such as a wireless local area network (LAN) (WLAN), wireless personal-area-network (PAN) (WPAN), peer-to-peer (P2P) network, mesh network, cellular network, wireless wide-area-network (WAN) (WWAN), and/or navigational network (e.g., the Global Positioning System (GPS) of North America or another Satellite Positioning System (SPS) or Global Navigation Satellite System (GNSS)). In the context of the example environment 100, the electronic device 102 can communicate various data and control information bidirectionally with the base station 104 via the wireless interface device 120. The electronic device 102 may, however, communicate directly with other peer devices, an alternative wireless network, and the like. Also, as described above, an electronic device 102 may alternatively be implemented as a base station 104 or another apparatus as set forth herein.

As shown in FIG. 1, the wireless interface device 120 can include at least one communication processor 124, at least one transceiver 126, and at least one radio-frequency front-end 128 (RFFE 128). These components process data information, control information, and signals associated with communicating information for the electronic device 102 via the antenna 122. The communication processor 124 may be implemented as at least part of a system-on-chip (SoC), as a modem processor, or as a baseband radio processor (BBP) that enables a digital communication interface for data, voice, messaging, or other applications of the electronic device 102. The communication processor 124 can include a digital signal processor (DSP) or one or more signal-processing blocks (not shown) for encoding and modulating data for transmission and for demodulating and decoding received data. Additionally, the communication processor 124 may also manage (e.g., control or configure) aspects or operation of the transceiver 126, the RF front-end 128, and other components of the wireless interface device 120 to implement various communication protocols or communication techniques.

In some cases, the application processor 108 and the communication processor 124 can be combined into one module or integrated circuit (IC), such as an SoC. Regardless, the application processor 108, the communication processor 124, or a processor generally can be operatively coupled to one or more other components, such as the CRM 110 or the display 118, to enable control of, or other interaction with, the various components of the electronic device 102. For example, at least one processor 108 or 124 can present one or more graphical images on a display screen implementation of the display 118 based on one or more wireless signals communicated (e.g., transmitted or received) via the at least one antenna 122 using components of the wireless interface device 120. Further, the application processor 108 or the communication processor 124, including a combination thereof, can be realized using digital circuitry that implements logic or functionality that is described herein. Additionally, the communication processor 124 may also include or be associated with a memory (not separately depicted) to store data and processor-executable instructions (e.g., code), such as the same CRM 110 or another CRM.

As shown, the wireless interface device 120 can include at least one mixer circuit 130, which is described below. More specifically, the transceiver 126 can include at least one mixer circuit 130-1, or the RF front-end 128 can include at least one mixer circuit 130-2 (including both components can have at least one mixer circuit 130 in accordance with an optional, but permitted herein, "inclusive-or" interpretation of the word "or"). The transceiver 126 can also include circuitry and logic for filtering, switching, amplification, channelization, frequency translation, and so forth.

Frequency translation functionality may include an up-conversion or a down-conversion of frequency that is performed through a single conversion operation (e.g., with a direct-conversion architecture) or through multiple conversion operations (e.g., with a superheterodyne architecture). The transceiver 126 can perform such frequency conversion (e.g., frequency translation) by using the mixer circuit 130-1 and an associated local oscillator (not shown in FIG. 1). Generally, the transceiver 126 can include filters, switches, amplifiers, mixers, and so forth for routing and conditioning signals that are transmitted or received via the antenna 122.

In addition to the mixer circuit 130-1, the transceiver 126 can include an analog-to-digital converter (ADC) or a digital-to-analog converter (DAC) (not shown in FIG. 1). In operation, an ADC can convert analog signals to digital signals, and a DAC can convert digital signals to analog signals. Generally, an ADC or a DAC can be implemented as part of the communication processor 124, as part of the transceiver 126, or separately from both (e.g., as another part of an SoC or as part of the application processor 108).

Figure 2:
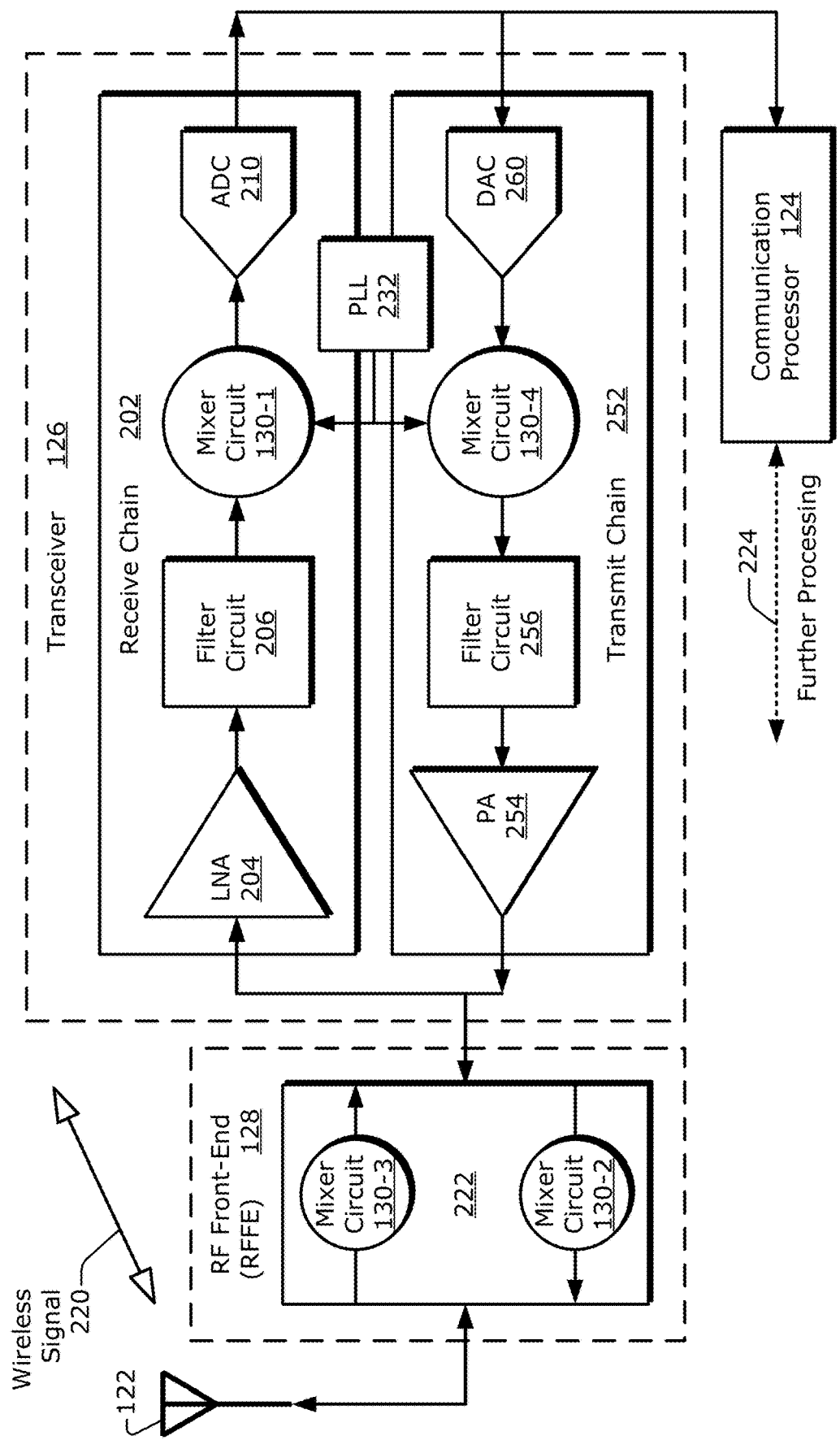
FIG. 2 is a schematic diagram illustrating an example radio-frequency (RF) front-end and an example transceiver that can each include at least one mixer circuit.

The components or circuitry of the transceiver 126 can be implemented in any suitable fashion, such as with combined transceiver logic or separately as respective transmitter and receiver entities. In some cases, the transceiver 126 is implemented with multiple or different sections to implement respective transmitting and receiving operations (e.g., with separate transmit and receive chains as depicted in FIG. 2). Although not shown in FIG. 1, the transceiver 126 may also include logic to perform in-phase/quadrature (I/Q) operations, such as synthesis, phase correction, modulation, demodulation, and the like.

The RF front-end 128 can also include one or more mixers—such as the mixer circuit 130-2—one or more filters, one or more switches, or one or more amplifiers for conditioning signals received via the antenna 122 or for conditioning signals to be transmitted via the antenna 122. The RF front-end 128 may also include a local oscillator, phase shifter (PS), peak detector, power meter, gain control block, antenna tuning circuit, N-plexer, balun, and the like. Configurable components of the RF front-end 128, such as some phase shifters, an automatic gain controller (AGC), or a reconfigurable version of the mixer circuit 130, may be controlled by the communication processor 124 to implement communications in various modes, with different frequency bands, or using beamforming. In some implementations, the antenna 122 is implemented as at least one antenna array that includes multiple antenna elements. Thus, as used herein, an "antenna" can refer to at least one discrete or independent antenna, to at least one antenna array that includes multiple antenna elements, or to a portion of an antenna array (e.g., an antenna element), depending on context or implementation.

In FIG. 1, an example mixer circuit 130 is depicted as being part of a transceiver 126 as a mixer circuit 130-1, as being part of an RF front-end 128 as a mixer circuit 130-2, and so forth. Described implementations of a mixer circuit 130 can, however, additionally or alternatively be employed in other portions of the wireless interface device 120 or in other portions of the electronic device 102 generally. As set forth above, a mixer circuit 130 can be included in an electronic device other than a cell phone, such as a base station 104. Also, with a base station (or with a mobile phone that uses a superheterodyne architecture), a mixer for an, e.g., intermediate frequency (IF) section of a wireless interface device 120 may be realized using a mixer circuit 130 as described herein. Other electronic device apparatuses that can employ a mixer circuit 130 include a laptop, communication hardware of a vehicle, a wireless access point, a wearable device, and so forth as described herein.

In example implementations, the mixer circuit 130 can include one or more switches 132-1 . . . 132-S, one or more capacitors 134-1 . . . 134-C, and one or more nodes 136-1 . . . 136-N. The variables "S," "C," and "N" are positive integers that may be the same as or different from each other. Although certain components are shown as being part of an example mixer circuit 130 in FIG. 1, a given mixer circuit may have more, fewer, or different components. Example frequency mixers, and the operation thereof, are described below with reference to FIGS. 4 through 8.

By using one or more aspects of the architectures and techniques that are described herein, a mixer circuit 130 can increase linearity with a symmetrical arrangement of components. For example, a symmetry-dependent linearity measurement referred to as the second-order intercept point (IP2 or IIP2) can be improved by approximately 5-10 decibels (dB) in some implementations. This improvement can combat at least some of the noise introduced by an associated local oscillator. The noise handling enables use of a single-balanced mixer in certain circumstances to thereby obviate use of a transformer and thus reduce an area consumed by a frequency converter that includes the mixer. Example implementations can also share capacitors or resistors to reduce wire counts or simplify signal routing, including both reduce wire counts and simplify signal routing.

Figure 5:
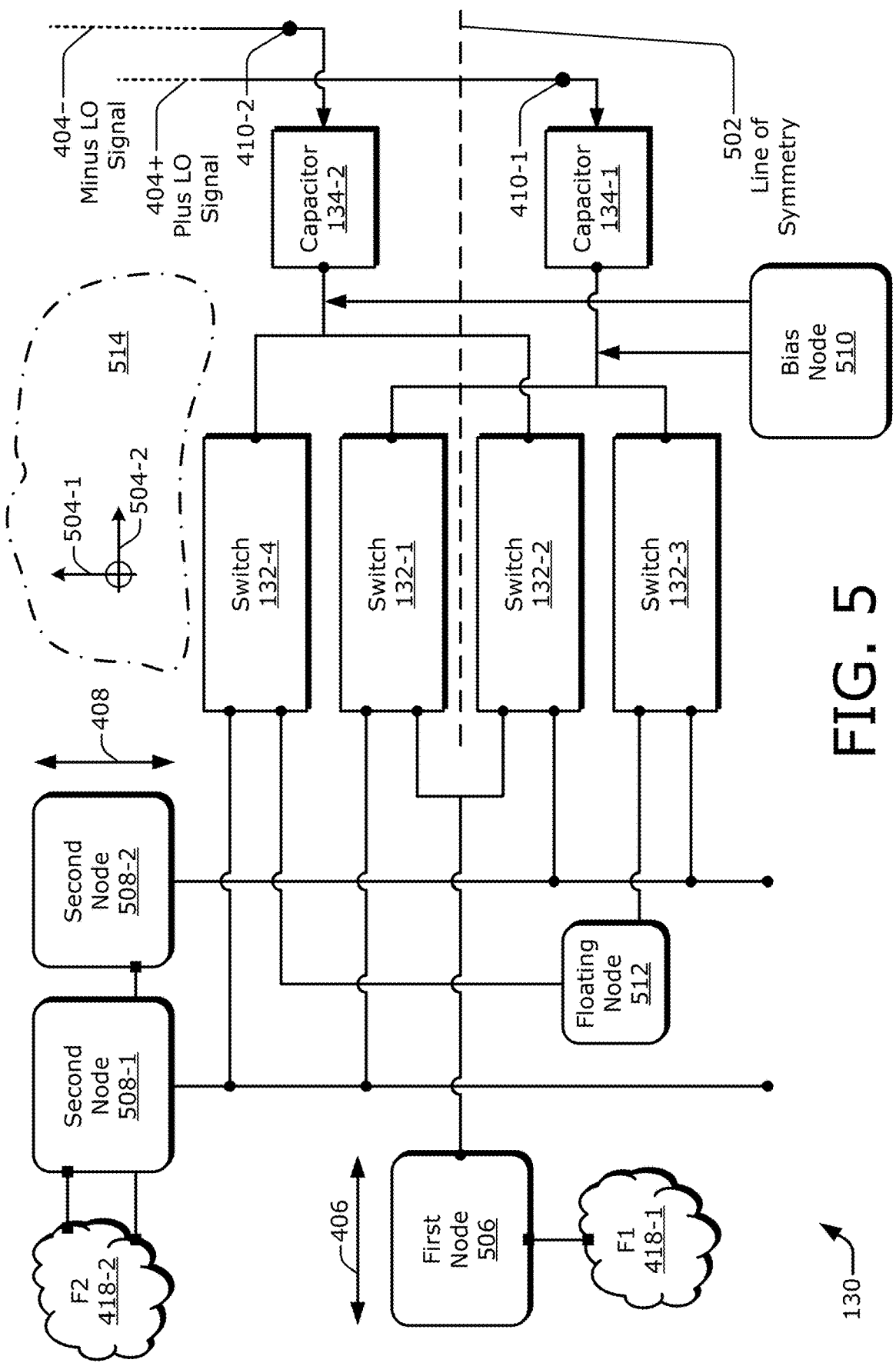
FIG. 5 is a schematic diagram illustrating an example mixer circuit including multiple nodes, multiple switches, and multiple capacitors.
Figure 6:
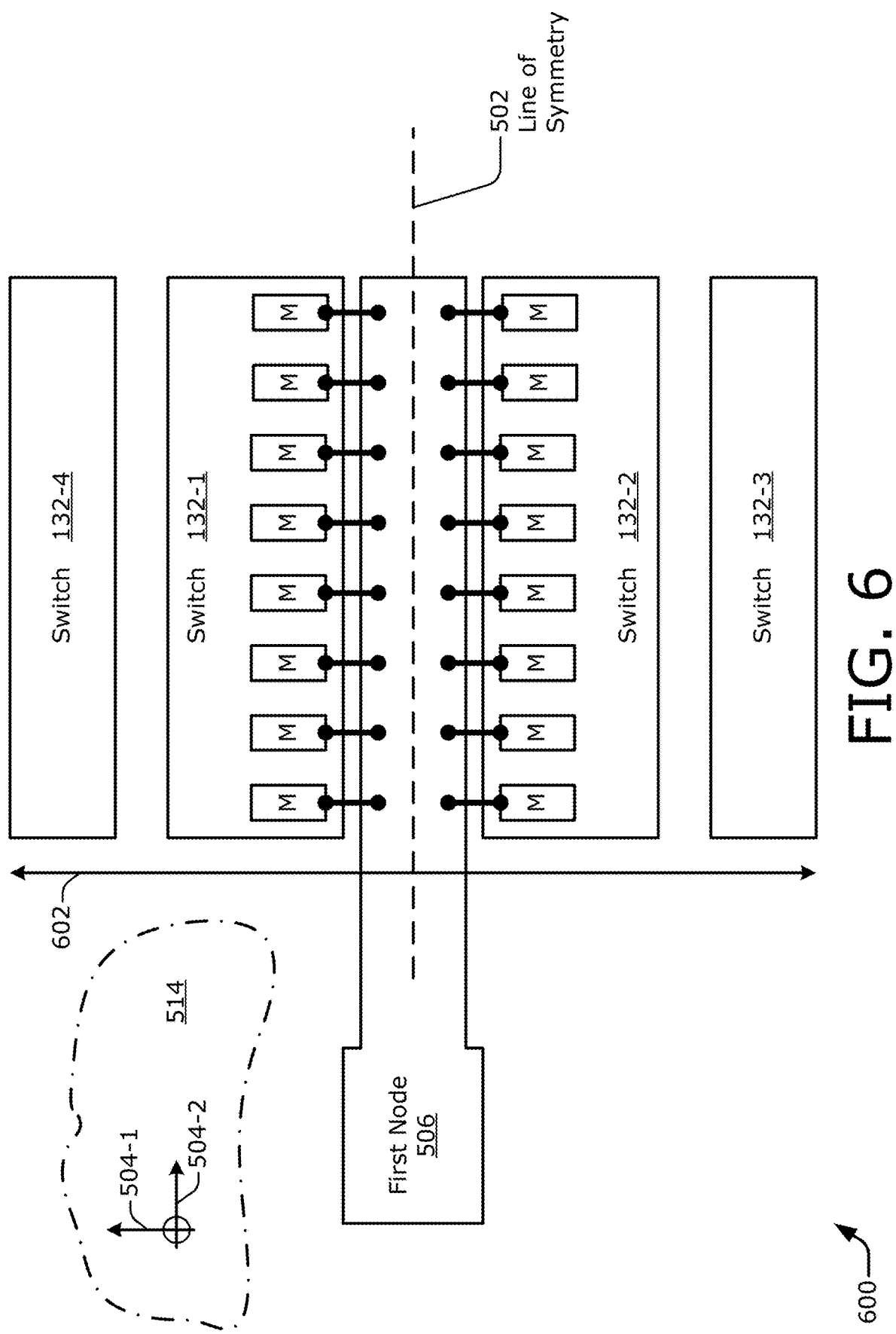
FIG. 6 is a schematic diagram illustrating an example implementation of multiple switches, including two that are symmetrically coupled to a node with respect to a line of symmetry.
Figure 7:
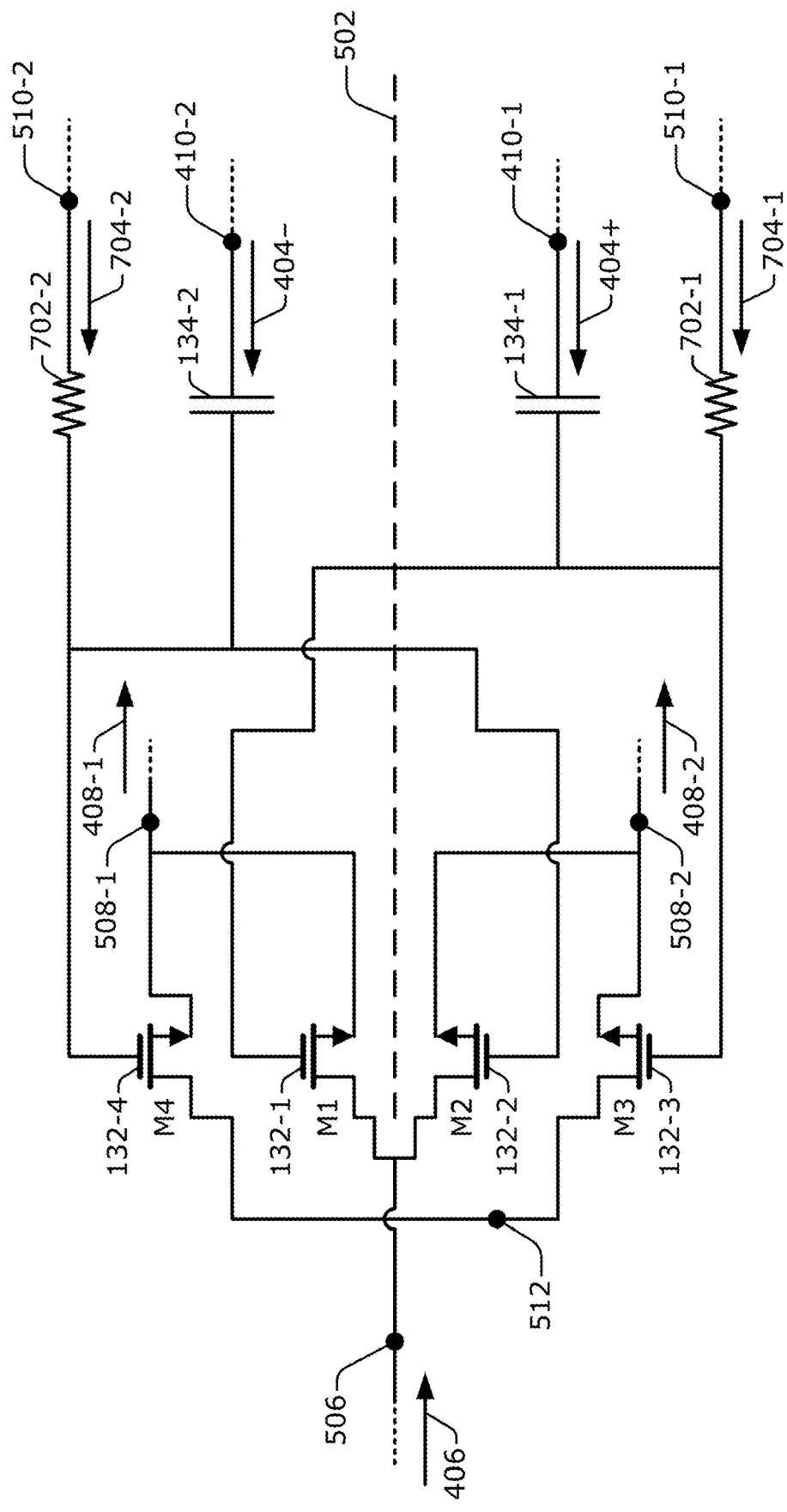
FIG. 7 is a circuit diagram illustrating an example mixer circuit including multiple nodes, multiple switches, multiple capacitors, and multiple resistors.

These advantages are multiplied by a quantity of transmit or receive chains that use a single-balanced mixer as described herein instead of a double-balanced mixer. Example schematic and circuit implementations are depicted in FIGS. 5 through 7 for mixer circuits that can be realized in accordance with described implementations. Next, however, this document describes example implementations of a transceiver and an RF front-end with reference to FIG. 2 and then example signal paths and frequency converters with reference to FIGS. 3 and 4.

FIG. 2 is a schematic diagram 200 illustrating an example RF front-end 128 and an example transceiver 126 that can each include at least one mixer circuit 130. FIG. 2 also depicts an antenna 122 and a communication processor 124. The communication processor 124 communicates one or more data signals to other components, such as the application processor 108 of FIG. 1, for further processing at 224 (e.g., for processing at an application level). As shown, the circuitry 200 can include a mixer circuit 130-1, a mixer circuit 130-2, a mixer circuit 130-3, or a mixer circuit 130-4, including one to four of such mixer circuits. The circuitry 200, however, may include a different quantity of frequency mixers (e.g., more or fewer), may include mixers that are coupled together differently, may include mixers in different locations, may include mixers that are implemented as part of a frequency converter, and so forth.

As illustrated from left to right, in example implementations, the antenna 122 is coupled to the RF front-end 128, and the RF front-end 128 is coupled to the transceiver 126. The transceiver 126 is coupled to the communication processor 124. The example RF front-end 128 includes at least one signal propagation path 222. The at least one signal propagation path 222 can include at least one mixer circuit 130, such as the mixer circuit 130-2 and the mixer circuit 130-3. The example transceiver 126 includes at least one receive chain 202 (or receive path 202) and at least one transmit chain 252 (or transmit path 252). Although only one RF front-end 128, one transceiver 126, and one communication processor 124 are shown at the circuitry 200, an electronic device 102, or a wireless interface device 120 thereof, can include multiple instances of any or all such components. Also, although only certain components are explicitly depicted in FIG. 2 and are shown coupled together in a particular manner, the transceiver 126 or the RF front-end 128 may include other non-illustrated components (e.g., switches or diplexers), more or fewer components, differently coupled arrangements of components, and so forth.

In some implementations, the RF front-end 128 couples the antenna 122 to the transceiver 126 via the signal propagation path 222. In operation, the signal propagation path 222 carries a signal between the antenna 122 and the transceiver 126. During or as part of the signal propagation, the signal propagation path 222 conditions the propagating signal, such as with the mixer circuit 130-2 or the mixer circuit 130-3. This enables the RF front-end 128 to couple a wireless signal 220 from the antenna 122 to the transceiver 126 as part of a reception operation. The RF front-end 128 also enables a transmission signal to be coupled from the transceiver 126 to the antenna 122 as part of a transmission operation to emanate a wireless signal 220. Although not explicitly shown in FIG. 2, an RF front-end 128, or a signal propagation path 222 thereof, may include one or more other components, such as another mixer, a filter, an amplifier (e.g., a power amplifier (PA) or a low-noise amplifier (LNA)), an N-plexer, a phase shifter, a diplexer, one or more switches, and so forth.

In some implementations, the transceiver 126 can include at least one receive chain 202, at least one transmit chain 252, or at least one receive chain 202 and at least one transmit chain 252. From left to right, the receive chain 202 can include a low noise amplifier 204 (LNA 204), a filter circuit 206, the mixer circuit 130-1 for frequency down-conversion, and an ADC 210. The transmit chain 252 can include a power amplifier 254 (PA 254), a filter circuit 256, the mixer circuit 130-4 for frequency up-conversion, and a DAC 260. However, the receive chain 202 or the transmit chain 252 can include other components—for example, additional amplifiers or mixers, multiple filters, one or more buffers, or at least one local oscillator—that are electrically or electromagnetically coupled anywhere along the depicted receive and transmit chains.

The receive chain 202 is coupled between the signal propagation path 222 of the RF front-end 128 and the communication processor 124—e.g., via the low-noise amplifier 204 and the ADC 210, respectively. The transmit chain 252 is coupled between the signal propagation path 222 and the communication processor 124—e.g., via the power amplifier 254 and the DAC 260, respectively. The transceiver 126 can also include at least one phase-locked loop 232 (PLL 232) that is coupled to the mixer circuit 130-1 or the mixer circuit 130-4. For example, the transceiver 126 can include one PLL 232 for each transmit/receive chain pair, one PLL 232 per transmit chain and one PLL 232 per receive chain, multiple PLLs 232 per chain, and so forth.

As shown along a signal propagation direction for certain example implementations of the receive chain 202, the antenna 122 is coupled to the low noise amplifier 204 via the signal propagation path 222 and the mixer circuit 130-3 thereof, and the low noise amplifier 204 is coupled to the filter circuit 206. The filter circuit 206 is coupled to the mixer circuit 130-1, and the mixer circuit 130-1 is coupled to the ADC 210. The ADC 210 is in turn coupled to the communication processor 124. As shown along a signal propagation direction for certain example implementations of the transmit chain 252, the communication processor 124 is coupled to the DAC 260, and the DAC 260 is coupled to the mixer circuit 130-4. The mixer circuit 130-4 is coupled to the filter circuit 256, and the filter circuit 256 is coupled to the power amplifier 254. The power amplifier 254 is coupled to the antenna 122 via the signal propagation path 222 using the mixer circuit 130-2 thereof. Although only one receive chain 202 and one transmit chain 252 are explicitly shown, an electronic device 102, or a transceiver 126 thereof, can include multiple instances of either or both components. Although the ADC 210 and the DAC 260 are illustrated as being separately coupled to the communication processor 124, they may share a bus or other means for communicating with the processor 124.

As part of an example signal-receiving operation, the mixer circuit 130-3 (if present) of the signal propagation path 222 down-converts a received signal (e.g., to an intermediate frequency (IF)) and forwards the down-converted signal to the low-noise amplifier 204. The low-noise amplifier 204 accepts the down-converted signal from the RF front-end 128 and provides an amplified signal to the filter circuit 206 based on the accepted signal. The filter circuit 206 filters the amplified signal and provides a filtered signal to the mixer circuit 130-1. The mixer circuit 130-1 performs a frequency down-conversion operation on the filtered signal to down-convert from one frequency to a lower frequency (e.g., from the IF to a baseband frequency (BBF) if the mixer circuit 130-3 is present or from a radio frequency (RF) to an IF or BBF in the absence of the mixer circuit 130-3). The mixer circuit 130-1 can perform the frequency down-conversion in a single conversion step or through multiple conversion steps using at least one PLL 232. The mixer circuit 130-1 can provide a down-converted analog signal to the ADC 210 for ADC conversion and subsequent forwarding to the communication processor 124 as a digital signal.

As part of an example signal-transmitting operation, the DAC 260 converts a digital signal received from the communication processor 124 to an analog signal. The mixer circuit 130-4 accepts the analog signal at a BBF or an IF from the DAC 260. The mixer circuit 130-4 upconverts the analog signal to a higher frequency, such as to an IF or an RF, to produce a higher-frequency signal using a signal generated by the PLL 232 to have a target synthesized frequency. The mixer circuit 130-4 provides the RF or other upconverted signal to the filter circuit 256. The filter circuit 256 filters the upconverted IF or RF signal and provides a filtered signal to the power amplifier 254. Thus, after the filtering by the filter circuit 256, the power amplifier 254 amplifies the filtered signal and provides an amplified signal to the signal propagation path 222 for signal conditioning. The RF front-end 128 can, for instance if the amplified signal is at IF, use the mixer circuit 130-2 of the signal propagation path 222 to provide an RF signal to the antenna 122 for emanation as a wireless signal 220.

Example implementations of a mixer circuit 130, as described herein, may be employed at any one or more of the example mixer circuits 130-1, 130-2, 130-3, or 130-4 in the transceiver 126 or the RF front-end 128 or at other mixers of an electronic device 102 (not shown in FIG. 2). The circuitry 200, however, depicts just some examples for a transceiver 126 and an RF front-end 128. In some cases, the various components that are illustrated in the drawings using separate schematic blocks or circuit elements may be manufactured or packaged in different discrete manners. For example, one physical module may include components of the RF front-end 128 and some components of the transceiver 126, and another physical module may combine the communication processor 124 with the remaining components of the transceiver 126. Further, in some cases, the antenna 122 may be co-packaged with at least some components of the RF front-end 128 or the transceiver 126.

In alternative implementations, one or more components may be physically or logically "shifted" to a different part of the wireless interface device 120 as compared to the illustrated circuitry 200 and/or may be incorporated into a different module. For example, a low-noise amplifier 204 or a power amplifier 254 may alternatively or additionally be deployed in the RF front-end 128. Similarly, an ADC 210 or a DAC 260 may alternatively be deployed in the communication processor 124.

Figure 3:
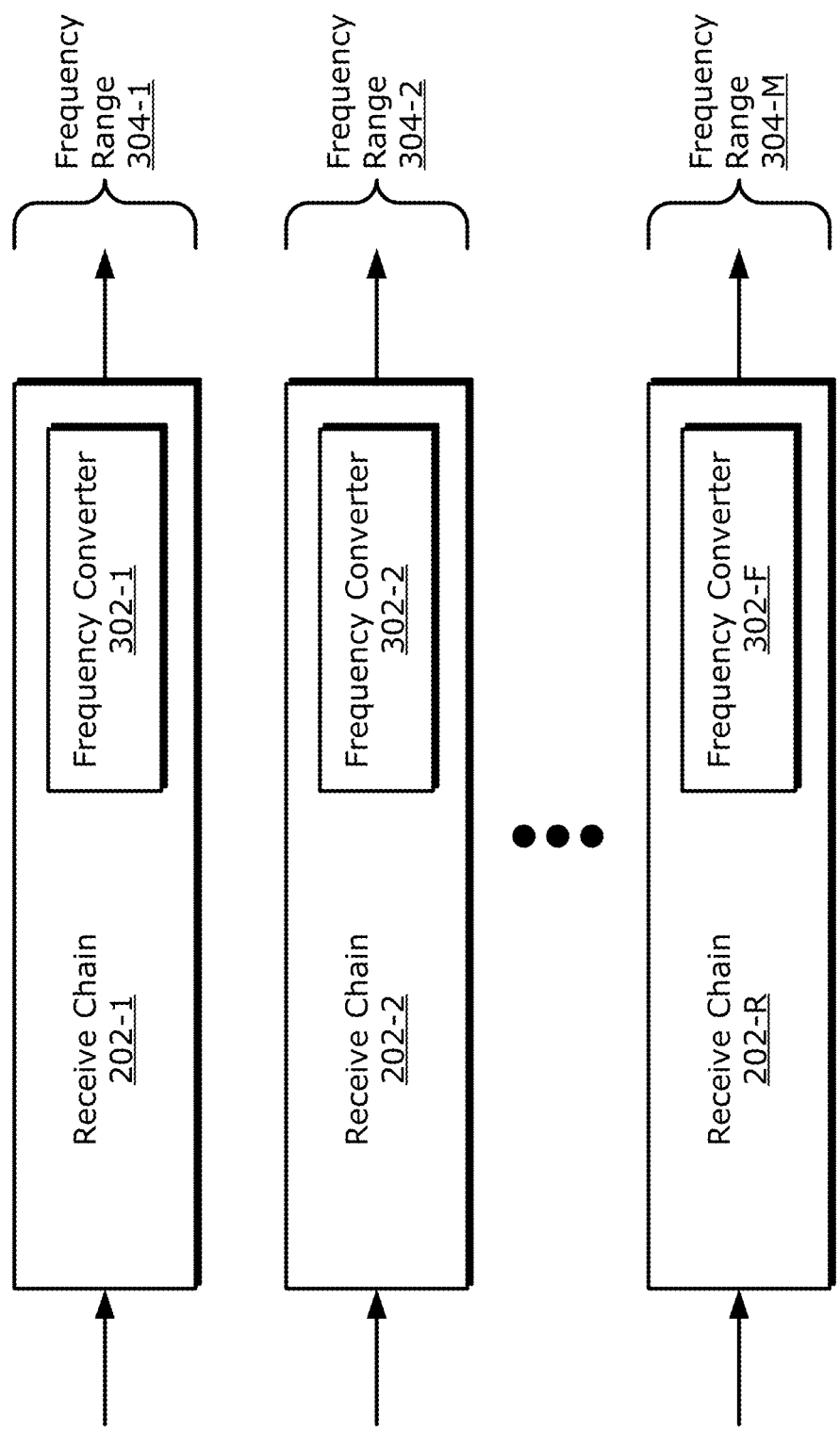
FIG. 3 is a schematic diagram illustrating an example of multiple receive chains that may each include at least one frequency converter as part of a wireless interface device.

FIG. 3 is a schematic diagram 300 illustrating an example of multiple receive chains that may each include at least one frequency converter as part of a wireless interface device. As shown, a wireless interface device 120 (e.g., of FIGS. 1 and 2) can include multiple receive chains 202-1, 202-2, . . . , 202-R, with "R" representing a positive integer. Each receive chain 202 includes at least one frequency converter 302. In FIG. 3, "F" frequency converters 302-1, 302-2, . . . , 302-F are depicted, with "F" representing a positive integer. For example, a first receive chain 202-1 includes a first frequency converter 302-1, a second receive chain 202-2 includes a second frequency converter 302-2, and an "Rth" receive chain 202-R includes an "Fth" frequency converter 302-F.

In some implementations, each respective receive chain 202 corresponds to a respective frequency range 304, such as a first frequency range 304-1, a second frequency range 304-2, and an "Mth" frequency range 304-M. Additionally or alternatively, each respective receive chain 202 may correspond to a respective wireless standard or communications protocol. Examples include a receive chain 202 for a mid-to-high band (MHB) frequency range 304, a receive chain 202 for a millimeter wave (mmW) frequency band 304, a receive chain 202 for a combined LAA and New Radio—Unlicensed (NR-U) access scheme, and so forth. The values for the variables "R," "F," and "M" may be the same as or different from each other.

Although only receive chains are shown in FIG. 3, a wireless interface device 120 may also or instead include multiple transmit chains, such as multiple instances of the transmit chain 252 (of FIG. 2). Each receive chain 202 or transmit chain 252 may include a respective frequency converter or multiple frequency converters or may share a frequency converter 202 with one or more other chains. Further, although a frequency converter 302 is illustrated in FIG. 3 as part of a receive chain and described above as part of a receive or transmit chain (or part of both), a frequency converter 302 may also be implemented separately from any chain. Additionally or alternatively, a frequency converter 302 may be implemented as part of an RF front-end 128. An RF front-end 128 may also include at least part of a receive chain 202 or a transmit chain 252.

Figure 4:
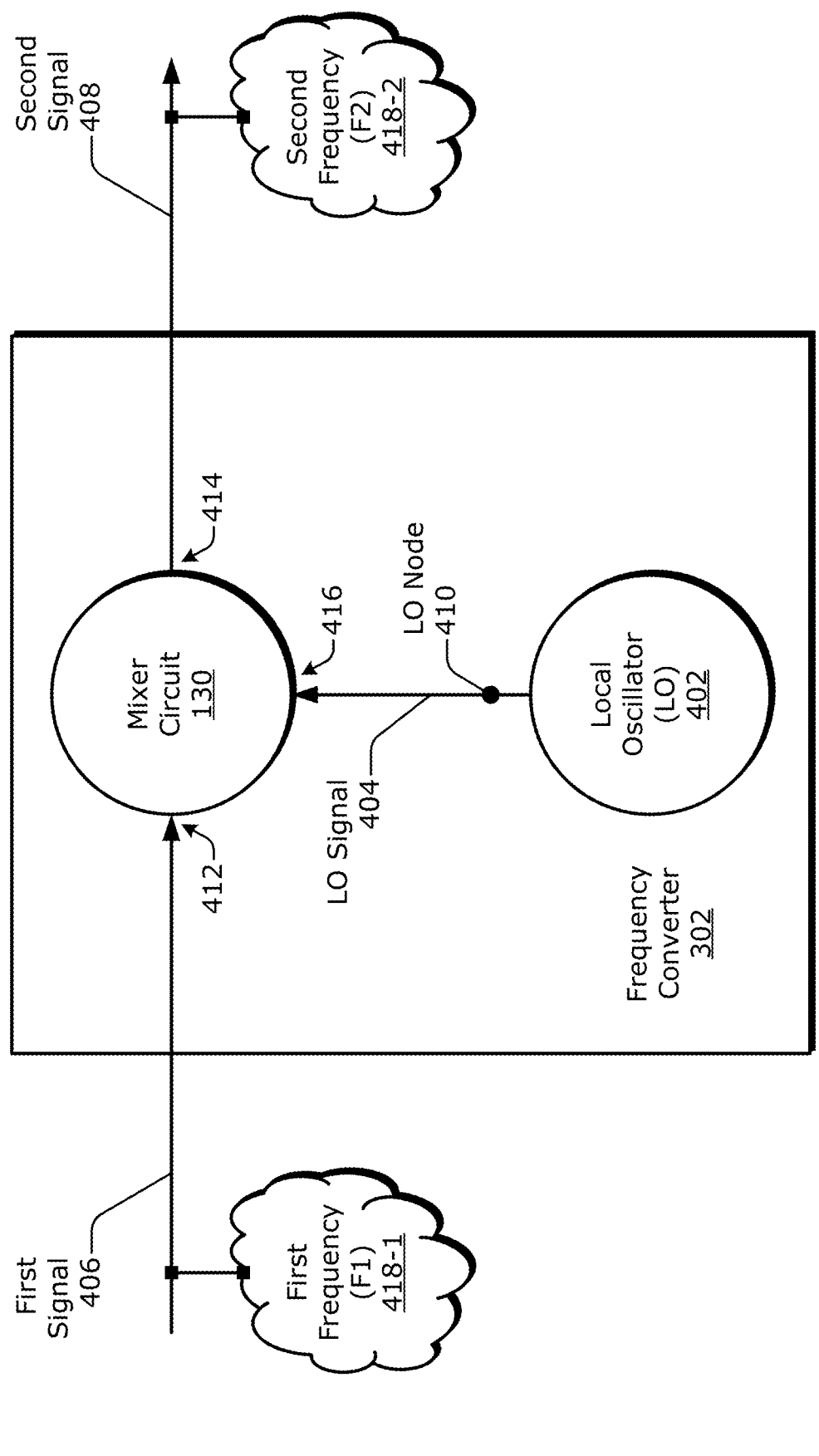
FIG. 4 is a schematic diagram illustrating an example frequency converter that includes a mixer circuit and a local oscillator.

FIG. 4 is a schematic diagram 400 illustrating an example frequency converter 302 that includes a mixer circuit 130 and a local oscillator 402. As shown, the mixer circuit 130 is coupled to the local oscillator 402 (LO 402). In example implementations, the mixer circuit 130 includes an input interface 412, an output interface 414, and a control interface 416 (or LO interface 416). The local oscillator 402 generates a local oscillator signal 404 (LO signal 404). The local oscillator signal 404 may be implemented as a balanced or differential signal as shown in FIGS. 5 and 6. The local oscillator 402 transmits or provides the local oscillator signal 404 to the mixer circuit 130 via at least one local oscillator node 410 (LO node 410). The mixer circuit 130 receives or accepts the local oscillator signal 404 through the control interface 416.

The mixer circuit 130 receives or accepts a first signal 406 through the input interface 412. The mixer circuit 130 can produce a second signal 408 based on the local oscillator signal 404 and the first signal 406 by performing a mixing operation (e.g., a multiplication operation). The mixer circuit 130 transmits or provides the second signal 408 through the output interface 414. The first signal 406 corresponds to a first frequency 418-1, and the second signal 408 corresponds to a second frequency 418-2, which is different from the first frequency 418-1. Thus, the frequency converter 302 (e.g., the mixer circuit 130 in conjunction with the local oscillator 402 or at least the local oscillator signal 404 therefrom) converts a signal having a first frequency 418-1 to another signal having a second frequency 418-2.

The frequency converter 302 can perform frequency up-conversion or frequency down-conversion. In some cases, the first signal 406 corresponds to an input signal of the frequency converter 302 or the mixer circuit 130 thereof, and the second signal 408 corresponds to an output signal of the frequency converter 302 or the mixer circuit 130 thereof. For frequency up-conversion, the second frequency 418-2 of the second signal 408 is greater than (e.g., higher than) the first frequency 418-1 of the first signal 406. For frequency down-conversion, the second frequency 418-2 of the second signal 408 is less than (e.g., lower than) the first frequency 418-1 of the first signal 406. In other implementations, however, a second signal may correspond to an input signal, and the first signal may correspond to an output signal, depending on configuration of a unidirectional mixer circuit or mode of a bidirectional mixer circuit.

FIG. 5 is a schematic diagram illustrating an example mixer circuit 130 including multiple nodes, multiple switches, and multiple capacitors. With reference also to FIG. 1, a mixer circuit 130 can include multiple switches 132-1 . . . 132-S, multiple capacitors 134-1 . . . 134-C, and multiple nodes 136-1 . . . 136-N. As shown for the example mixer circuit 130 of FIG. 5, there are four (4) switches, so "S" can be equal to four. There are two (2) capacitors, so "C" can be equal to two. There are seven (7) identified nodes, so "N" can equal seven. Each of these components, however, may have more or fewer instances than the quantity that is depicted in FIG. 5 or described herein.

In example implementations, the multiple switches 132-1 . . . 132-S can include at least a first switch 132-1, a second switch 132-2, a third switch 132-3, and a fourth switch 132-4. The multiple capacitors 134-1 . . . 134-C can include a first capacitor 134-1 and a second capacitor 134-2. With reference also to FIG. 4, the at least one local oscillator node 410 can be realized with multiple local oscillator nodes, such as a first local oscillator node 410-1 and a second local oscillator node 410-2. The multiple local oscillator nodes can support a differential signaling implementation of the local oscillator signal 404. Accordingly, the first local oscillator node 410-1 and the second local oscillator node 410-2 may comprise a plus local oscillator node and a minus local oscillator node. Further, the local oscillator signal 404 can include a plus LO signal 404+ and a minus LO signal 404−. The plus LO signal 404+ and the minus LO signal 404− may also be referred to as first and second local oscillator signals.

The mixer circuit 130 can also include a first node 506 and multiple second nodes 508-1 and 508-2. The first node 506 can correspond to the first frequency 418-1 based, for instance, on a frequency of signal that traverses over the first node 506. The multiple second nodes 508-1 and 508-2 can correspond to the second frequency 418-2. The multiple second nodes 508-1 and 508-2 may jointly carry a differential signal. Accordingly, the multiple second nodes 508-1 and 508-2 may also be referred to as a plus second node 508-1 and a minus second node 508-2. The mixer circuit 130 can further include at least one bias node 510 and at least one floating node 512. The bias node 510 can provide at least one bias signal, such as a gate bias voltage, to the multiple switches 132-1 to 132-4. The floating node 512 enables the mixer circuit 130 to realize a single-balanced mixer architecture. Although each of the specific nodes are depicted and described with a particular quantity, each node may have more or fewer instances thereof.

As illustrated, the multiple capacitors 134-1 and 134-2 are coupled between the multiple local oscillator nodes 410-1 and 410-2 and the multiple second nodes 508-1 and 508-2. The multiple switches 132-1 to 132-4 are coupled between the multiple capacitors 134-1 and 134-2 and the multiple second nodes 508-1 and 508-2. The first switch 132-1 and the second switch 132-2 are coupled between the multiple capacitors 134-1 and 134-2 and the first node 506. Further, the third switch 132-3 and the fourth switch 132-4 are coupled to each other via a floating node 512.

The first capacitor 134-1 can be coupled between the first local oscillator node 410-1 and the first and third switches 132-1 and 132-3. The second capacitor 134-2 can be coupled between the second local oscillator node 410-2 and the second and fourth switches 132-2 and 132-4. The at least one bias node 510 can be coupled to the first and third switches 132-1 and 132-3 and to the second and fourth switches 132-2 and 132-4. Bias node examples are described further below with reference to FIG. 7.

In example operations, the first node 506 can provide to the mixer circuit 130 a first signal, such as the first signal 406 (also of FIG. 4), corresponding to the first frequency 418-1. The multiple second nodes 508-1 and 508-2 can accept from the mixer circuit 130 a second signal, such as the second signal 408 (also of FIG. 4), corresponding to the second frequency 418-2. Alternatively, the multiple second nodes 508-1 and 508-2 can provide to the mixer circuit 130 a second signal 408, and the first node 506 can accept from the mixer circuit 130 a first signal 406. In some cases, the first signal 406 can be realized as an unbalanced signal, and the second signal 408 can be realized as a balanced signal.

In some implementations, one or more of the components depicted in FIG. 5 are disposed on a substrate 514, such as a semiconductor material like silicon. The substrate 514 defines a plane in which multiple axes can lie. As shown, a first axis 504-1 and a second axis 504-2 lie within the plane defined by the substrate 514. The first axis 504-1 and the second axis 504-2 are at least substantially perpendicular to each other. A line of symmetry 502 (LOS 502) can also lie within the plane 514. At least a portion of the illustrated components can be arranged substantially symmetrically around, or with respect to, the line of symmetry 502. In some cases, the line of symmetry 502 can be at least substantially parallel to an axis 504, such as the second axis 504-2. This can include the line of symmetry 502 being colinear with the second axis 504-2 or being parallel to a degree enabled by a given process technology (e.g., within 10 degrees, within 5 degrees, or within 1 degree).

In example aspects, the first switch 132-1 and the second switch 132-2 are disposed between the fourth switch 132-4 and the third switch 132-3. The first switch 132-1 and the second switch 132-2 are coupled to the first node 506 to communicate information-related signaling, such as the first signal 406. In contrast, the fourth switch 132-4 and the third switch 132-3 are coupled to the floating node 512. In this respect, the fourth switch 132-4 and the third switch 132-3 can operate as "dummy switches" with respect to the first node 506 or the first signal 406.

In other aspects, the first switch 132-1 can be disposed on the substrate 514 between the fourth switch 132-4 and the second switch 132-2. Further, the second switch 132-2 can be disposed on the substrate 514 between the first switch 132-1 and the third switch 132-3. In certain symmetry-related aspects, the first switch 132-1 and the fourth switch 132-4 are symmetrically positioned on a first side of (e.g., above as depicted in FIG. 5) of the line of symmetry 502, and the second switch 132-2 and the third switch 132-3 are symmetrically positioned on a second side of (e.g., below as depicted in FIG. 5) the line of symmetry 502. Similarly, the second capacitor 134-2 can be positioned on the first side of the line of symmetry 502, and the first capacitor 134-1 can be positioned on the second side of the line of symmetry 502.

Additionally or alternatively, the first switch 132-1, the second switch 132-2, the third switch 132-3, and the fourth switch 132-4 can be disposed on a substrate in the plane 514 along a line (not shown in FIG. 5, but see FIG. 7) that is at least substantially parallel to the first axis 504-1. This can include the line being colinear with the first axis 504-1 or parallel to a degree enabled by a given manufacturing technology. An example of this arrangement is described below with reference to FIG. 6.

In example implementations in which the local oscillator 402 (of FIG. 4) provides a differential local oscillator signal 404, the multiple local oscillator nodes can include a plus local oscillator node 410-1 and a minus local oscillator node 410-2. The first capacitor 134-1 may be coupled between the plus local oscillator node 410-1 and the first switch 132-1, and the first capacitor 134-1 may be also coupled between the plus local oscillator node 410-1 and the third switch 132-3. The second capacitor 134-2 may be coupled between the minus local oscillator node 410-2 and the fourth switch 132-4, and the second capacitor 134-2 may be also coupled between the minus local oscillator node 410-2 and the second switch 132-2.

FIG. 6 is a schematic diagram 600 illustrating an example implementation of multiple switches 132-1 to 132-4, including two that are symmetrically coupled to a node (e.g., the first node 506). FIG. 6 also depicts the substrate 514 and two axes lying in the plane defined by the substrate 514. The two axes are the first axis 504-1 and the second axis 504-2. The line of symmetry 502 extends at least substantially parallel to the second axis 504-2 in the plane of the substrate 514.

In example implementations, the multiple switches 132-1 to 132-4 are disposed in the plane of the substrate 514 along a line 602. The line 602 is at least substantially parallel with the first axis 504-1 and is at least substantially perpendicular to the line of symmetry 502. As shown, the first switch 132-1 and the second switch 132-2 are symmetrically coupled to the first node 506 along, or across from, the line of symmetry 502. Each of the first and second switches 132-1 and 132-2 can include multiple transistors, which are designed by an "M" character in FIGS. 6 and 7. Although eight transistors are shown for each of the first and second switches 132-1 and 132-2, each switch 132 may be formed from more or fewer transistors, including one transistor.

For clarity, the multiple second nodes 508-1 and 508-2 are omitted from FIG. 6. Additionally, each of the third and fourth switches 132-3 and 132-4 may also include one or more transistors. Further, although a particular symmetrical arrangement for the first and second switches 132-1 and 132-2 relative to the first node 506 and the line of symmetry 502 is shown in FIG. 6, the first and second switches 132-1 and 132-2 may be symmetrically positioned on the substrate in different manners.

FIG. 7 is a circuit diagram 700 illustrating an example mixer circuit including multiple nodes, multiple switches, multiple capacitors, and multiple resistors. The circuit diagram 700 provides an example circuit-level implementation of the schematic diagram of FIG. 5. In contrast with FIG. 5, the multiple switches 132-1 to 132-4 are each depicted with at least one transistor M. As shown, the first switch 132-1 is implemented with at least one transistor M1, and the second switch 132-2 is implemented with at least one transistor M2. The third switch 132-3 is implemented with at least one transistor M3, and the fourth switch 132-4 is implemented with at least one transistor M4.

The second signal 408 is realized with a differential signal including a first instance of a second signal 408-1 and a second instance of a second signal 408-2. These signals may also be referred to as a plus second signal 408-1 and a minus second signal 408-2. A differential signal may be realized as, for example, two complementary signals or two signals with opposite polarities. In example operations, the second signal 408-1 can propagate through the second node 508-1 (which can be referred to as a plus second node 508-1), and the second signal 408-2 can propagate over the second node 508-2 (which can be referred to as a minus second node 508-2).

In further contrast with FIG. 5, the at least one bias node 510 is realized as a first bias node 510-1 and a second bias node 510-2. To bias the transistors M1-M4, a bias signal 704 is provided to each transistor M. The bias signal can be, for instance, a DC voltage from a power distribution network node. Examples of power distribution network nodes include a power supply node, such as a power rail, and a ground node, such as a ground plane. In some cases, the bias signal 704 may be separated into a first bias signal 704-1 and a second bias signal 704-2.

Each respective bias signal 704 can be provided to at least one transistor M via at least one resistor 702 (e.g., a bias resistor). With separate bias signals, the at least one resistor 702 can be realized with separate resistors of multiple resistors. For example, the mixer circuit 130 can bias a first transistor M1 and a third transistor M3 with a first bias signal 704-1 via a first resistor 702-1. Also, the mixer circuit 130 can bias a second transistor M2 and a fourth transistor M4 with a second bias signal 704-2 via a second resistor 702-2.

Generally, each switch 132 can be implemented with at least one transistor. The transistors may be realized with any one or more of multiple transistor types. Examples transistor types include a field effect transistor (FET), a junction FET (JFET), a metal-oxide-semiconductor FET (MOSFET), a bipolar junction transistor (BJT), an insulated-gate bipolar transistor (IGBT), and so forth. Manufacturers may fabricate FETs as n-channel or p-channel transistor types and may fabricate BJTs as NPN or PNP transistor types.

Each transistor may include at least one control terminal and one or more channel terminals. With an FET transistor, a control terminal can correspond to a gate terminal, and a channel terminal can correspond to a source terminal or a drain terminal. With a BJT transistor, a control terminal can correspond to a base terminal, and a channel terminal can correspond to an emitter terminal or a collector terminal.

To bias each transistor M, a bias signal 704 is provided to a respective control terminal of each transistor M. In FIG. 7, each transistor M is realized as an n-channel FET having a gate terminal, a drain terminal, and a source terminal. The multiple bias signals 704-1 and 704-2 are coupled to the gate terminal of one or more transistors. For instance, the first bias signal 704-1 can be coupled to the gate terminal of the first and third transistors M1 and M3 through the first resistor 702-1. Analogously, the second bias signal 704-2 can be coupled to the gate terminal of the second and fourth transistors M2 and M4 through the second resistor 702-2. Although the transistors are depicted as n-channel FETs in FIG. 7, mixer circuits can be implemented with p-channel FETs, BJTs of any type, combinations thereof, and so forth.

As shown for certain implementations, multiple bias nodes can include the first bias node 510-1 and the second bias node 510-2, and multiple bias resistors can include the first resistor 702-1 and the second resistor 702-2. The first resistor 702-1 may be coupled between the first bias node 510-1 and the first switch 132-1 (e.g., the first transistor M1), and the first resistor 702-1 may be also coupled between the first bias node 510-1 and the third switch 132-3 (e.g., the third transistor M3). The second resistor 702-2 may be coupled between the second bias node 510-2 and the fourth switch 132-4 (e.g., the fourth transistor M4), and the second resistor 702-2 may be also coupled between the second bias node 510-2 and the second switch 132-2 (e.g., the second transistor M2).

In example implementations, each transistor M is coupled between two nodes via respective channel terminals. For instance, the first transistor M1 can be coupled between the first node 506 and a first instance of the second node 508-1 (e.g., a plus second node 508-1). The second transistor M2 can be coupled between the first node 506 and a second instance of the second node 508-2 (e.g., a minus second node 508-2). The third transistor M3 can be coupled between the floating node 512 and the second instance of the second node 508-2 (e.g., the minus second node 508-2). The fourth transistor M4 can be coupled between the floating node 512 and the first instance of the second node 508-1 (e.g., the plus second node 508-1).

Example couplings to different terminals of the transistors forming the multiple switches 132-1 to 132-4 are described next. In certain example couplings, the first capacitor 134-1 is coupled between the first local oscillator node 410-1 and respective control terminals (e.g., gate terminals for an FET implementation) of the first and third switches 132-1 and 132-3 (e.g., the first and third transistors M1 and M3). The second capacitor 134-2 is coupled between the second local oscillator node 410-2 and respective control terminals (e.g., gate terminals for an FET implementation) of the fourth and second switches 132-4 and 132-2 (e.g., the transistors M4 and M2).

In other example couplings, the first resistor 702-1 of the multiple resistors is coupled between the first bias node 510-1 and the respective control terminals (e.g., gate terminals for an FET implementation) of the first and third switches 132-1 and 132-3. The second resistor 702-2 of the multiple resistors is coupled between the second bias node 510-2 and the respective control terminals (e.g., gate terminals for an FET implementation) of the fourth and second switches 132-4 and 132-2.

In still other example couplings, the first switch 132-1 and the second switch 132-2 are coupled to the first node 506 via respective first terminals of a first terminal type of a given transistor type. The third switch 132-3 and the fourth switch 132-4 are coupled to each other via respective first terminals of the first terminal type (e.g., through the floating node 512). Further, a second node 508-1 of the multiple second nodes 508-1 and 508-2 is coupled to the fourth and first switches 132-4 and 132-1 via respective second terminals of a second terminal type. Another second node 508-2 of the multiple second nodes 508-1 and 508-2 is coupled to the second and third switches 132-2 and 132-3 via respective second terminals of the second terminal type. These terminal types may correspond to channel terminals. As shown for the depicted FETs, the first terminal type may correspond to a drain terminal of a transistor M, and the second terminal type may correspond to a source terminal of a transistor M.

In certain implementations, the first switch 132-1 (e.g., including the first transistor M1) and the second switch 132-2 (e.g., including the second transistor M2) are disposed on a substrate between the fourth switch 132-4 (e.g., including the fourth transistor M4) and the third switch 132-3 (e.g., including the third transistor M3). The first switch 132-1 (e.g., including the first transistor M1) and the second switch 132-2 (e.g., including the second transistor M2) are coupled to a same node (e.g., the first node 506) to communicate (e.g., receive/accept or transmit/provide) a same signal (e.g., the first signal 406) that carries user or application-level information (e.g., in contrast with the oscillation signal 404 which may lack user or application-level information).

This provides a mechanism to increase symmetry-dependent linearity of the mixer circuit 130. The mechanism to increase the symmetry-dependent linearity can be further boosted by symmetrically positioning the multiple switches. For example, the first switch 132-1 and the fourth switch 132-4 can be positioned on a first side of the line of symmetry 502, and the second switch 132-2 and the third switch 132-3 can be positioned on a second side of the line of symmetry 502.

Area consumption of the mixer circuit 130 can be decreased by implementing a mechanism for sharing one or more components. For example, each capacitor 134 of the multiple capacitors can be shared across two or more switches of the multiple switches. For instance, the first capacitor 134-1 of the multiple capacitors 134-1 and 134-2 can be shared across the first and third switches 132-1 and 132-3 of the multiple switches 132-1 to 132-4. As another example, each resistor 702 of the multiple resistors can be shared across two or more switches of the multiple switches. For instance, the second resistor 702-2 of the multiple resistors 702-1 and 702-2 can be shared across the second and fourth switches 132-2 and 132-4 of the multiple switches 132-1 to 132-4. This sharing can also simplify layout or routing (including both) to further reduce are consumption.

Figure 8:
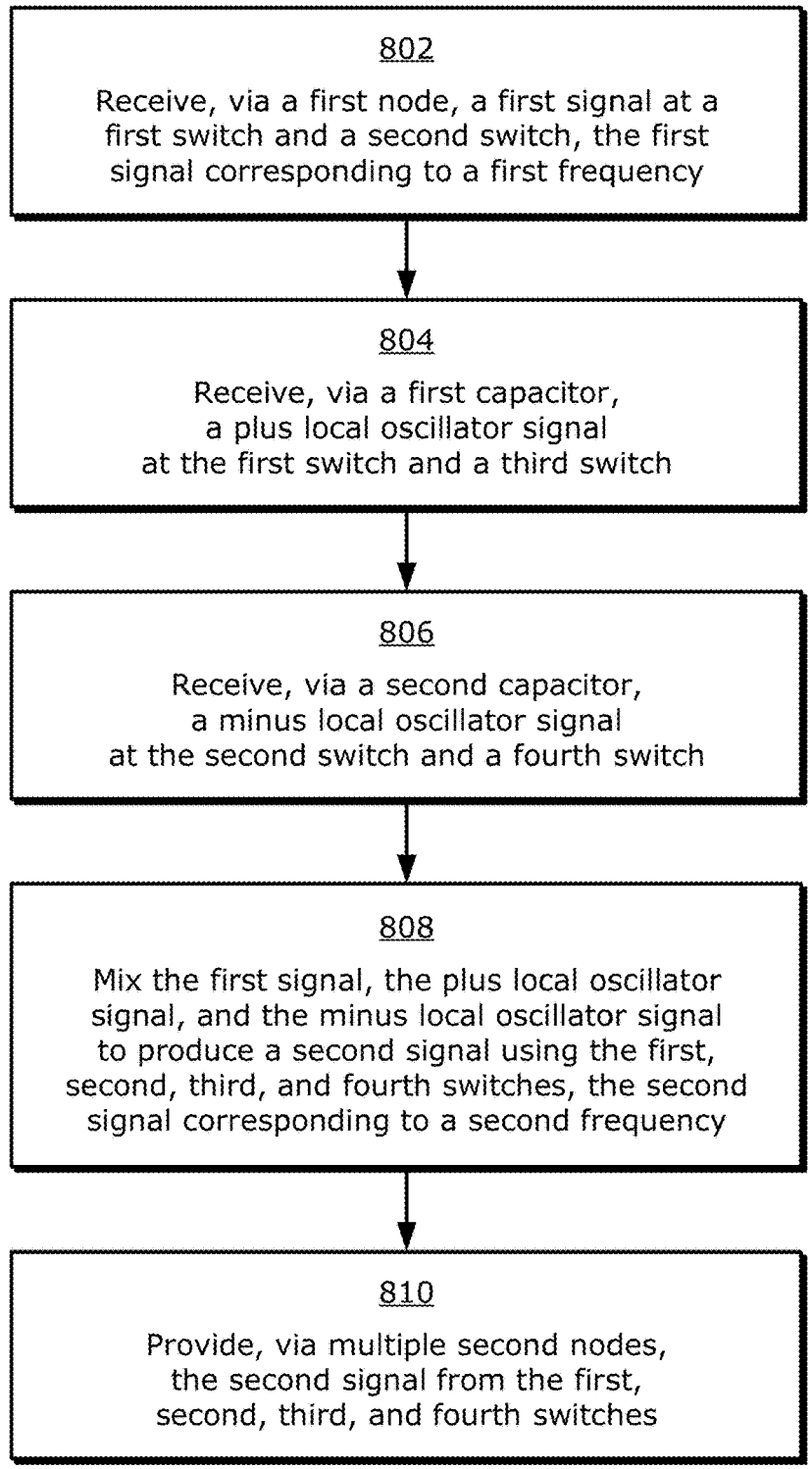
FIG. 8 is a flow diagram illustrating an example process for mixing signals and/or operating a mixer circuit.

FIG. 8 is a flow diagram illustrating an example process 800 for mixing signals and/or operating a mixer circuit. The process 800 includes five blocks 802-810 that specify operations that can be performed for a method.

At block 802, a first signal is received, via a first node, at a first switch and a second switch, with the first signal corresponding to a first frequency. For example, a mixer circuit 130 can receive, via a first node 506, a first signal 406 at a first switch 132-1 and a second switch 132-2, with the first signal 406 corresponding to a first frequency 418-1. For instance, a first transistor M1 and a second transistor M2 may receive the first signal 406 at respective first channel terminals thereof as part of a receive chain 202 or a transmit chain 252. Here, the first signal 406 may be a single-ended signal on the unbalanced side of a single-balanced implementation of the mixer circuit 130.

At block 804, a plus local oscillator signal is received, via a first capacitor, at the first switch and a third switch. For example, the mixer circuit 130 can receive, via a first capacitor 134-1, a plus local oscillator signal 404+ at the first switch 132-1 and a third switch 132-3. In some cases, the first transistor M1 and a third transistor M3 may receive the plus local oscillator signal 404+ at respective gate terminals thereof via the first capacitor 134-1. Accordingly, the first transistor M1 and the third transistor M3 may "share" the first capacitor 134-1 to reduce an area occupied by the mixer circuit 130, including by simplifying layout and routing. The first transistor M1 and the third transistor M3 may also share a bias resistor instead of having two separate bias resistors.

At block 806, a minus local oscillator signal is received, via a second capacitor, at the second switch and a fourth switch. For example, the mixer circuit 130 can receive, via a second capacitor 134-2, a minus local oscillator signal 404− at the second switch 132-2 and a fourth switch 132-4. In some cases, the second transistor M2 and a fourth transistor M4 may receive the minus local oscillator signal 404− at respective gate terminals thereof via the second capacitor 134-2. Accordingly, the second transistor M2 and the fourth transistor M4 may "share" the second capacitor 134-2. The second transistor M2 and the fourth transistor M4 may also share a bias resistor. To support, e.g., linearity-dependent performance parameters, the first transistor M1 and the second transistor M2 may be disposed on a substrate 514 between the third transistor M3 and the fourth transistor M4.

At block 808, the first signal, the plus local oscillator signal, and the minus local oscillator signal are mixed to produce a second signal using the first, second, third, and fourth switches, with the second signal corresponding to a second frequency. For example, the mixer circuit 130 can mix the first signal 406, the plus local oscillator signal 404+, and the minus local oscillator signal 404− to produce a second signal 408 using the first, second, third, and fourth switches 132-1, 132-2, 132-3, and 132-4, with the second signal 408 corresponding to a second frequency 418-2. To do so, the first, second, third, and fourth transistors M1, M2, M3, and M4 may be turned on and off by the plus or minus oscillator signals 404+ or 404− to combine the first signal 406 with the oscillator signal 404 using a mathematical operation to produce the second signal 408 with a frequency that differs from that of the first signal 406. With the third and fourth switches 132-3 and 132-4 not receiving an input signal (and being coupled to each other), the third and fourth switches 132-3 and 132-4 may be operated as dummy switches, at least with respect to the first signal 406.

At block 810, the second signal is provided, via multiple second nodes, from the first, second, third, and fourth switches. For example, the mixer circuit 130 can provide, via multiple second nodes 508-1 and 508-2, the second signal 408 from the first, second, third, and fourth switches 132-1, 132-2, 132-3, and 132-4. Thus, the first, second, third, and fourth transistors M1, M2, M3, and M4 can output the second signal 408 at respective second channel terminals thereof as part of a frequency converter 302. Here, the second signal 408 may include a plus second signal 408-1 and a minus second signal 408-2 to realize a differential signal on the balanced side of a single-balanced implementation of the mixer circuit 130.

FIG. 8 is a flow diagram illustrating example processes or methods related to mixing signals and/or operating a mixer circuit. The processes are described in the form of a set of blocks that specify operations that can be performed. However, operations are not necessarily limited to the order shown in the figures or described herein, for the operations may be implemented in alternative orders or in fully or partially overlapping manners. Also, more, fewer, and/or different operations may be implemented to perform a respective process or an alternative process. Operations represented by the illustrated blocks of each process may be performed by an electronic device, such as the electronic device 102 of FIG. 1 or the wireless interface device 120 thereof. More specifically, the operations of the respective processes may be performed by a mixer circuit 130 of a transceiver 126 or an RF front-end 128, independently or in conjunction with other components.

Implementation Examples

This section describes some aspects of example implementations and/or example configurations related to the apparatuses and/or processes presented above.

Example aspect 1: An apparatus comprising:
  a mixer circuit comprising:
    multiple local oscillator nodes;
    a first node corresponding to a first frequency;
    multiple second nodes corresponding to a second frequency;
    multiple capacitors coupled between the multiple local oscillator nodes and the multiple second nodes; and
    multiple switches comprising a first switch, a second switch, a third switch, and a fourth switch; the multiple switches coupled between the multiple capacitors and the multiple second nodes; the first switch and the second switch coupled between the multiple capacitors and the first node; and the first switch and the second switch disposed between the fourth switch and the third switch.

Example aspect 2: The apparatus of example aspect 1, wherein:
the third switch and the fourth switch are coupled to each other via a floating node.

Example aspect 3: The apparatus of example aspect 1 or 2, wherein:
the first node is configured to provide to the mixer circuit a first signal corresponding to the first frequency; and
the multiple second nodes are configured to accept from the mixer circuit a second signal corresponding to the second frequency.

Example aspect 4: The apparatus of example aspect 3, wherein:
the first signal comprises an unbalanced signal; and
the second signal comprises a balanced signal.

Example aspect 5: The apparatus of any one of example aspects 2 to 4, wherein:
the first switch is disposed on a substrate between the fourth switch and the second switch; and
the second switch is disposed on the substrate between the first switch and the third switch.

Example aspect 6: The apparatus of any one of example aspects 2 to 5, wherein:
the first switch and the fourth switch are symmetrically positioned on a first side of a line of symmetry, and the second switch and the third switch are symmetrically positioned on a second side of the line of symmetry.

Example aspect 7: The apparatus of example aspect 6, wherein:
the substrate defines a plane;
the plane includes a first axis and a second axis, the first axis substantially perpendicular to the second axis, the second axis at least substantially parallel to the line of symmetry; and
the first switch, the second switch, the third switch, and the fourth switch are disposed on the substrate in the plane along a line that is at least substantially parallel to the first axis.

Example aspect 8: The apparatus of example aspect 6 or 7, wherein:
the multiple capacitors comprise a first capacitor and a second capacitor;
the first capacitor is positioned on the second side of the line of symmetry; and
the second capacitor is positioned on the first side of the line of symmetry.

Example aspect 9: The apparatus of example aspect 8, wherein:
the multiple local oscillator nodes comprise a first local oscillator node and a second local oscillator node;
the first capacitor is coupled between the first local oscillator node and the first and third switches; and
the second capacitor is coupled between the second local oscillator node and the second and fourth switches.

Example aspect 10: The apparatus of any one of preceding example aspects, wherein:
the multiple local oscillator nodes comprise a plus local oscillator node and a minus local oscillator node;
the multiple capacitors comprise a first capacitor and a second capacitor;
the first capacitor is coupled between the plus local oscillator node and the first switch;
the first capacitor is coupled between the plus local oscillator node and the third switch;
the second capacitor is coupled between the minus local oscillator node and the fourth switch; and
the second capacitor is coupled between the minus local oscillator node and the second switch.

Example aspect 11: The apparatus of any one of the preceding example aspects, wherein:
the mixer circuit comprises:
multiple bias nodes comprising a first bias node and a second bias node; and
multiple bias resistors comprising a first resistor and a second resistor;
the first resistor is coupled between the first bias node and the first switch;
the first resistor is coupled between the first bias node and the third switch;
the second resistor is coupled between the second bias node and the fourth switch; and
the second resistor is coupled between the second bias node and the second switch.

Example aspect 12: The apparatus of any one of the preceding example aspects, further comprising:
a local oscillator coupled to the multiple local oscillator nodes,
wherein the mixer circuit is configured to convert a frequency of a signal between the first frequency and the second frequency.

Example aspect 13: The apparatus of any one of the preceding example aspects, further comprising:
at least one transmit chain comprising the mixer circuit,
wherein the mixer circuit is configured to perform frequency up-conversion.

Example aspect 14: The apparatus of any one of the preceding example aspects, further comprising:
at least one receive chain comprising the mixer circuit,
wherein the mixer circuit is configured to perform frequency down-conversion.

Example aspect 15: The apparatus of example aspect 14, further comprising:
a wireless interface device comprising the at least one receive chain;
a display screen; and
at least one processor operatively coupled to the display screen and at least a portion of the wireless interface device, the at least one processor configured to present one or more graphical images on the display screen based on one or more wireless signals communicated using the mixer circuit of the wireless interface device.

Example aspect 16: An apparatus comprising:
a mixer circuit comprising:
multiple local oscillator nodes;
a first node corresponding to a first frequency;
multiple second nodes corresponding to a second frequency;
multiple capacitors coupled between the multiple local oscillator nodes and the multiple second nodes;
multiple switches comprising a first switch, a second switch, a third switch, and a fourth switch; the multiple switches coupled between the multiple capacitors and the multiple second nodes; the first switch and the second switch coupled between the multiple capacitors and the first node; the third switch and the fourth switch coupled to each other via a floating node; and
means for increasing symmetry-dependent linearity.

Example aspect 17: The apparatus of example aspect 16, wherein the means for increasing symmetry-dependent linearity comprises:

means for symmetrically positioning the first switch and the fourth switch on a first side of a line of symmetry and the second switch and the third switch on a second side of the line of symmetry.

Example aspect 18: The apparatus of example aspect 16 or 17, further comprising:
means for sharing each capacitor of the multiple capacitors across two or more switches of the multiple switches.

Example aspect 19: The apparatus of any one of example aspects 16 to 18, further comprising:
multiple resistors coupled to the multiple switches; and
means for sharing each resistor of the multiple resistors across two or more switches of the multiple switches.

Example aspect 20: An apparatus comprising:
a mixer circuit comprising:
a first local oscillator node and a second local oscillator node;
a first node corresponding to a first frequency;
a second node and a third node each corresponding to a second frequency;
a first capacitor and a second capacitor;
a first switch coupled between the first capacitor and the second node, the first switch further coupled between the first capacitor and the first node;
a second switch coupled between the second capacitor and the third node, the second switch further coupled between the second capacitor and the first node;
a third switch coupled between the first capacitor and the third node; and
a fourth switch coupled between the second capacitor and the second node,
the first capacitor coupled between the first local oscillator node and the first and third switches, and the second capacitor coupled between the second local oscillator node and the fourth and second switches.

Example aspect 21: The apparatus of example aspect 20, further comprising:
a local oscillator, wherein:
the first local oscillator node is coupled between the local oscillator and the first capacitor; and
the second local oscillator node is coupled between the local oscillator and the second capacitor.

Example aspect 22: The apparatus of example aspect 20 or 21, wherein:
the first capacitor is coupled between the first local oscillator node and respective control terminals of the first and third switches; and
the second capacitor is coupled between the second local oscillator node and respective control terminals of the fourth and second switches.

Example aspect 23: The apparatus of example aspect 22, further comprising:
a first resistor and a second resistor, wherein:
the first resistor is coupled between a first bias node and the respective control terminals of the first and third switches; and
the second resistor is coupled between a second bias node and the respective control terminals of the fourth and second switches.

Example aspect 24: The apparatus of example aspect 22 or 23, wherein:
the first switch and the second switch are coupled to the first node via respective first terminals of a first terminal type; and
the third switch and the fourth switch are coupled to each other via respective first terminals of the first terminal type.

Example aspect 25: The apparatus of any one of example aspects 22 to 24, wherein:
the second node is coupled to the fourth and first switches via respective second terminals of a second terminal type; and
the third node is coupled to the second and third switches via respective second terminals of the second terminal type.

Example aspect 26: The apparatus of example aspect 25, wherein:
the first terminal type comprises a drain terminal of a transistor; and
the second terminal type comprises a source terminal of a transistor.

Example aspect 27: The apparatus of any one of example aspects 20 to 26, wherein:
the first switch and the second switch are disposed between the fourth switch and the third switch.

Example aspect 28: The apparatus of any one of example aspects 20 to 27, further comprising:
a substrate, wherein:
the first switch is disposed on the substrate between the fourth switch and the second switch;
the second switch is disposed on the substrate between the first switch and the third switch; and
the first switch and the fourth switch are symmetrically positioned on a first side of a line of symmetry lying in a plane defined by the substrate, and the second switch and the third switch are symmetrically positioned on a second side of the line of symmetry.

Example aspect 29: A method for mixing signals, the method comprising:
receiving, via a first node, a first signal at a first switch and a second switch, the first signal corresponding to a first frequency;
receiving, via a first capacitor, a plus local oscillator signal at the first switch and a third switch;
receiving, via a second capacitor, a minus local oscillator signal at the second switch and a fourth switch;
mixing the first signal, the plus local oscillator signal, and the minus local oscillator signal to produce a second signal using the first, second, third, and fourth switches, the second signal corresponding to a second frequency; and
providing, via multiple second nodes, the second signal from the first, second, third, and fourth switches.

Example aspect 30: The method of example aspect 29, further comprising:
operating the third switch and the fourth switch as dummy switches with respect to the first signal.

CONCLUSION

As used herein, the terms "couple," "coupled," or "coupling" refer to a relationship between two or more components that are in operative communication with each other to implement some feature or realize some capability that is described herein. The coupling can be realized using, for instance, a physical line, such as a metal trace or wire, or an electromagnetic coupling, such as with a transformer. A coupling can include a direct coupling or an indirect coupling. A direct coupling refers to connecting discrete circuit elements via a same node without an intervening element. An indirect coupling refers to connecting discrete circuit elements via one or more other devices or other discrete circuit elements, including two or more different nodes.

The term "node" (e.g., including a "first node" or a "local oscillator node") represents at least a point of electrical connection between two or more components (e.g., circuit elements). Although at times a node may be visually depicted in a drawing as a single point, the node can represent a connection portion of a physical circuit or network that has approximately a same voltage potential at or along the connection portion between two or more components. In other words, a node can represent at least one of multiple points along a conducting medium (e.g., a wire or trace) that exists between electrically connected components. Similarly, a "terminal" may represent one or more points with at least approximately a same voltage potential relative to an input or output of a component (e.g., a transistor).

The terms "first," "second," "third," and other numeric-related indicators are used herein to identify or distinguish similar or analogous items from one another within a given context—such as a particular implementation, a single drawing figure, a given component, or a claim. Thus, a first item in one context may differ from a first item in another context. For example, an item identified as a "first node" in one context may be identified as a "second node" in another context. Similarly, a "first capacitor" or a "first switch" in one claim may be recited as a "second capacitor" or a "third switch," respectively, in a different claim (e.g., in separate claim sets).

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

Although implementations for frequency mixing have been described in language specific to certain features and/or methods, the subject of the appended claims is not necessarily limited to the specific features or methods described. Rather, the specific features and methods are disclosed as example implementations for frequency mixing.

What is claimed is:

1. An apparatus comprising:
a mixer circuit comprising:
multiple local oscillator nodes;
a first node corresponding to a first frequency;
multiple second nodes corresponding to a second frequency;
multiple capacitors coupled between the multiple local oscillator nodes and the multiple second nodes; and
multiple switches comprising a first switch, a second switch, a third switch, and a fourth switch; the multiple switches coupled between the multiple capacitors and the multiple second nodes; the first switch and the second switch coupled between the multiple capacitors and the first node; and the first switch and the second switch disposed between the fourth switch and the third switch.

2. The apparatus of claim 1, wherein:
the third switch and the fourth switch are coupled to each other via a floating node.

3. The apparatus of claim 2, wherein:
the first node is configured to provide to the mixer circuit a first signal corresponding to the first frequency; and
the multiple second nodes are configured to accept from the mixer circuit a second signal corresponding to the second frequency.

4. The apparatus of claim 3, wherein:
the first signal comprises an unbalanced signal; and
the second signal comprises a balanced signal.

5. The apparatus of claim 2, wherein:
the first switch is disposed on a substrate between the fourth switch and the second switch; and
the second switch is disposed on the substrate between the first switch and the third switch.

6. The apparatus of claim 5, wherein:
the first switch and the fourth switch are symmetrically positioned on a first side of a line of symmetry, and the second switch and the third switch are symmetrically positioned on a second side of the line of symmetry.

7. The apparatus of claim 6, wherein:
the substrate defines a plane;
the plane includes a first axis and a second axis, the first axis substantially perpendicular to the second axis, the second axis at least substantially parallel to the line of symmetry; and
the first switch, the second switch, the third switch, and the fourth switch are disposed on the substrate in the plane along a line that is at least substantially parallel to the first axis.

8. The apparatus of claim 6, wherein:
the multiple capacitors comprise a first capacitor and a second capacitor;
the first capacitor is positioned on the second side of the line of symmetry; and
the second capacitor is positioned on the first side of the line of symmetry.

9. The apparatus of claim 8, wherein:
the multiple local oscillator nodes comprise a first local oscillator node and a second local oscillator node;
the first capacitor is coupled between the first local oscillator node and the first and third switches; and
the second capacitor is coupled between the second local oscillator node and the second and fourth switches.

10. The apparatus of claim 1, wherein:
the multiple local oscillator nodes comprise a plus local oscillator node and a minus local oscillator node;
the multiple capacitors comprise a first capacitor and a second capacitor;
the first capacitor is coupled between the plus local oscillator node and the first switch;
the first capacitor is coupled between the plus local oscillator node and the third switch;
the second capacitor is coupled between the minus local oscillator node and the fourth switch; and
the second capacitor is coupled between the minus local oscillator node and the second switch.

11. The apparatus of claim 10, wherein:
the mixer circuit comprises:
multiple bias nodes comprising a first bias node and a second bias node; and
multiple bias resistors comprising a first resistor and a second resistor;

the first resistor is coupled between the first bias node and the first switch;

the first resistor is coupled between the first bias node and the third switch;

the second resistor is coupled between the second bias node and the fourth switch; and the second resistor is coupled between the second bias node and the second switch.

12. The apparatus of claim 1, further comprising:
a local oscillator coupled to the multiple local oscillator nodes,
wherein the mixer circuit is configured to convert a frequency of a signal between the first frequency and the second frequency.

13. The apparatus of claim 1, further comprising:
at least one transmit chain comprising the mixer circuit,
wherein the mixer circuit is configured to perform frequency up-conversion.

14. The apparatus of claim 1, further comprising:
at least one receive chain comprising the mixer circuit,
wherein the mixer circuit is configured to perform frequency down-conversion.

15. The apparatus of claim 14, further comprising:
a wireless interface device comprising the at least one receive chain;
a display screen; and
at least one processor operatively coupled to the display screen and at least a portion of the wireless interface device, the at least one processor configured to present one or more graphical images on the display screen based on one or more wireless signals communicated using the mixer circuit of the wireless interface device.

16. An apparatus comprising:
a mixer circuit comprising:
multiple local oscillator nodes;
a first node corresponding to a first frequency;
multiple second nodes corresponding to a second frequency;
multiple capacitors coupled between the multiple local oscillator nodes and the multiple second nodes;
multiple switches comprising a first switch, a second switch, a third switch, and a fourth switch; the multiple switches coupled between the multiple capacitors and the multiple second nodes; the first switch and the second switch coupled between the multiple capacitors and the first node; the third switch and the fourth switch coupled to each other via a floating node; and
means for increasing symmetry-dependent linearity.

17. The apparatus of claim 16, wherein the means for increasing symmetry-dependent linearity comprises:
means for symmetrically positioning the first switch and the fourth switch on a first side of a line of symmetry and the second switch and the third switch on a second side of the line of symmetry.

18. The apparatus of claim 16, further comprising:
means for sharing each capacitor of the multiple capacitors across two or more switches of the multiple switches.

19. The apparatus of claim 18, further comprising:
multiple resistors coupled to the multiple switches; and
means for sharing each resistor of the multiple resistors across two or more switches of the multiple switches.

20. An apparatus comprising:
a mixer circuit comprising:
a first local oscillator node and a second local oscillator node;

a first node corresponding to a first frequency;
a second node and a third node each corresponding to a second frequency;
a first capacitor and a second capacitor;
a first switch coupled between the first capacitor and the second node, the first switch further coupled between the first capacitor and the first node;
a second switch coupled between the second capacitor and the third node, the second switch further coupled between the second capacitor and the first node;
a third switch coupled between the first capacitor and the third node; and
a fourth switch coupled between the second capacitor and the second node,
the first capacitor coupled between the first local oscillator node and the first and third switches, and the second capacitor coupled between the second local oscillator node and the fourth and second switches.

21. The apparatus of claim 20, further comprising:
a local oscillator, wherein:
the first local oscillator node is coupled between the local oscillator and the first capacitor; and
the second local oscillator node is coupled between the local oscillator and the second capacitor.

22. The apparatus of claim 20, wherein:
the first capacitor is coupled between the first local oscillator node and respective control terminals of the first and third switches; and
the second capacitor is coupled between the second local oscillator node and respective control terminals of the fourth and second switches.

23. The apparatus of claim 22, further comprising:
a first resistor and a second resistor, wherein:
the first resistor is coupled between a first bias node and the respective control terminals of the first and third switches; and
the second resistor is coupled between a second bias node and the respective control terminals of the fourth and second switches.

24. The apparatus of claim 22, wherein:
the first switch and the second switch are coupled to the first node via respective first terminals of a first terminal type; and
the third switch and the fourth switch are coupled to each other via respective first terminals of the first terminal type.

25. The apparatus of claim 24, wherein:
the second node is coupled to the fourth and first switches via respective second terminals of a second terminal type; and
the third node is coupled to the second and third switches via respective second terminals of the second terminal type.

26. The apparatus of claim 25, wherein:
the first terminal type comprises a drain terminal of a transistor; and
the second terminal type comprises a source terminal of a transistor.

27. The apparatus of claim 20, wherein:
the first switch and the second switch are disposed between the fourth switch and the third switch.

28. The apparatus of claim 20, further comprising:
a substrate, wherein:
the first switch is disposed on the substrate between the fourth switch and the second switch;
the second switch is disposed on the substrate between the first switch and the third switch; and the first switch and the fourth switch are symmetrically positioned on a first side of a line of symmetry lying in a plane defined by the substrate, and the second switch and the third switch are symmetrically positioned on a second side of the line of symmetry.

29. A method for mixing signals, the method comprising:

receiving, via a first node, a first signal at a first switch and a second switch, the first signal corresponding to a first frequency;

receiving, via a first capacitor, a plus local oscillator signal at the first switch and a third switch;

receiving, via a second capacitor, a minus local oscillator signal at the second switch and a fourth switch;

mixing the first signal, the plus local oscillator signal, and the minus local oscillator signal to produce a second signal using the first, second, third, and fourth switches, the second signal corresponding to a second frequency; and providing, via multiple second nodes, the second signal from the first, second, third, and fourth switches.

30. The method of claim 29, further comprising:

operating the third switch and the fourth switch as dummy switches with respect to the first signal.

\* \* \* \* \*